United States Patent [19]
Nakagawa et al.

[11] Patent Number: 5,472,813
[45] Date of Patent: Dec. 5, 1995

[54] PATTERN EXPOSING METHOD USING PHASE SHIFT AND MASK USED THEREFOR

[75] Inventors: Kenji Nakagawa; Masao Kanazawa; Tamae Haruki; Yasuko Tabata, all of Kawasaki, Japan

[73] Assignee: Fujitsu Limited, Kanagawa, Japan

[21] Appl. No.: 274,689

[22] Filed: Jul. 14, 1994

Related U.S. Application Data

[62] Division of Ser. No. 940,408, Sep. 3, 1992, Pat. No. 5,364,716.

[30] Foreign Application Priority Data

| Sep. 27, 1991 | [JP] | Japan | 3-249276 |
| Oct. 4, 1991 | [JP] | Japan | 3-257293 |
| Dec. 13, 1991 | [JP] | Japan | 3-329367 |
| Jul. 17, 1992 | [JP] | Japan | 4-191125 |

[51] Int. Cl.⁶ ............................................ G03F 9/00
[52] U.S. Cl. .................... 430/5; 430/312; 430/325; 430/326; 430/394
[58] Field of Search ................... 430/5, 312, 325, 430/326, 394

[56] References Cited

U.S. PATENT DOCUMENTS

| 4,869,999 | 9/1989 | Fukuda et al. | 430/394 |
| 5,134,058 | 7/1992 | Han | 430/394 |

FOREIGN PATENT DOCUMENTS

| 0433467 | 12/1989 | European Pat. Off. . |
| 0395425 | 4/1990 | European Pat. Off. . |
| 0464492 | 6/1991 | European Pat. Off. . |
| 56-056632 | 5/1981 | Japan . |
| 56-165325 | 12/1981 | Japan . |
| 60-15928 | 1/1985 | Japan . |
| 1-248150 | 10/1989 | Japan . |

OTHER PUBLICATIONS

Japanese Journal of Applied Physics, vol. 30, No. 5, May 1991, Tokyo, Japan, pp. 1131–1136, XP263716 Toshihiko Tanaka et al. A Novel Optical Lithography Technique Using the Phase–Shifter Fringe.

"0.2 μm or Less i–Line Lithography by Phase–Shifting–Mask Technology", Jinbo et al, International Electron Devices Meeting, 1990, pp. 825–828.

*Primary Examiner*—Mark A. Chapman
*Attorney, Agent, or Firm*—Nikaido, Marmelstein, Murray & Oram

[57] ABSTRACT

A pattern exposing method forms a predetermined resist pattern on a substrate by exposing a first resist layer which is formed on the substrate using a first reticle which includes a first pattern for exposing a first corresponding pattern on the first resist layer by use of a phase shift of light transmitted through the first reticle, developing the exposed first resist layer, exposing a second resist layer which is formed on the entire surface of the substrate, including a top of the first resist layer, using a second reticle which has a second pattern for exposing a second corresponding pattern on the second resist layer by use of light transmitted through the second reticle, where the second corresponding pattern overlaps at least a part of the first corresponding pattern, and developing the second resist layer so that a part of the first corresponding pattern is removed by the second corresponding pattern and the predetermined resist pattern is formed.

5 Claims, 21 Drawing Sheets

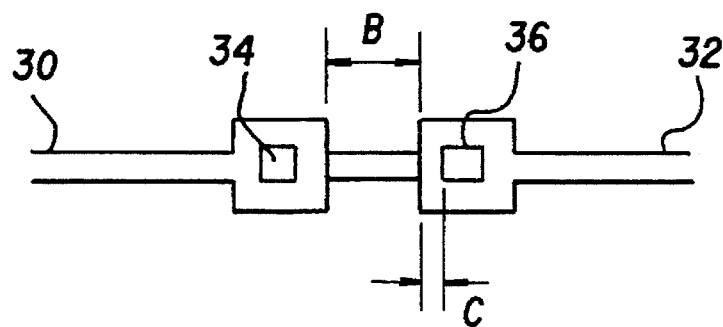
FIG.9(a)
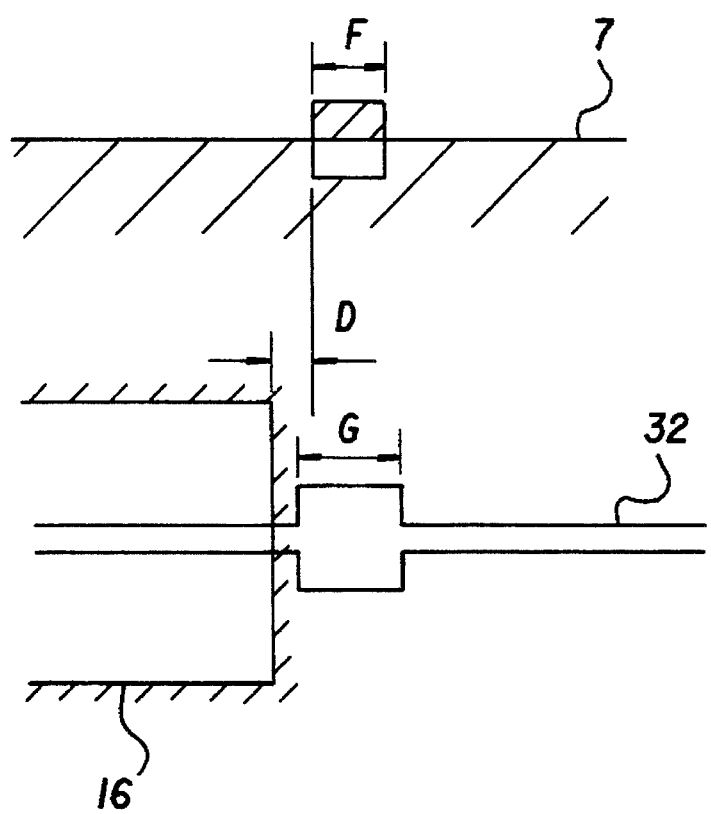
FIG.9(b)
FIG.9(c)

PATTERN EXPOSING METHOD USING PHASE SHIFT AND MASK USED THEREFOR

This is a divisional, of application Ser. No. 07/940,408 filed Sep. 3, 1992, now U.S. Pat. No. 5,364,716.

FIELD OF THE INVENTION

The present invention generally relates to pattern exposing methods and masks used therefor, and more particularly to a pattern exposing method which forms a resist pattern for the purpose of producing a semiconductor device and to a mask which is used for such a pattern exposing method.

BACKGROUND OF THE INVENTION

Recently, the operation speed and integration density of semiconductor devices have increased considerably, and the size of the semiconductor devices has been reduced accordingly. For this reason, there are demands to form a fine pattern exceeding a resolution limit of the conventional patterning apparatus using an optical system, that is, the resolution limit of an imaging optical system of a wafer stepper, for example.

First, a description will be given of the general operation of a conventional demagnification projection exposure apparatus, by referring to FIG. 1.

A light from a light source such as a mercury lamp is irradiated on a reticle 1. The reticle 1 has a reticle pattern in which a chromium (Cr) light blocking layer 3 is formed on a glass substrate 2, so as to expose a hole having a rectangular shape corresponding to the rectangular shape of the light blocking layer 3. The reticle pattern is reduced by a demagnification projection lens 4 and is imaged on a wafer 5 so as to expose a positive resist on the wafer 5.

FIG. 2 is a diagram for explaining the light intensity of the exposure light on the positive resist. FIG. 2(a) shows a partial cross section of the reticle 1. FIG. 2(b) shows the light amplitude distribution on the positive resist of the wafer 5 for the case where the exposure is made using the reticle 1. FIG. 2(c) shows the light intensity distribution on the positive resist of the wafer 5 for the case where the exposure is made using the reticle 1.

When the exposure is made by the light transmitted through the reticle 1 having the rectangular light blocking layer 3, the light intensity distribution on the positive resist of the wafer 5 has a negative peak having a relatively gradual slope. Hence, it is impossible to form a fine pattern which has a narrow width using such a light intensity distribution. In order to form a fine pattern which has a narrow width, it is necessary to make the slope of the negative peak sharper than that of the light intensity distribution shown in FIG. 2(c).

For example, if the exposure light is an i-line having a wavelength of 0.365 μm and the numerical aperture of the optical system is 0.50, the resolution limit is approximately 0.4 μm.

The slope of the negative peak of the light intensity distribution shown in FIG. 2(c) is dependent on the resolution of the imaging optical system. The resolution of the imaging optical system is determined by the exposure wavelength, the numerical aperture, the inconsistent performance of each individual lens itself and the like.

Accordingly, when the conventional demagnification projection exposure apparatus is used, it is impossible to form a fine hole which exceeds the resolution limit of the imaging optical system, and there is a problem in that the conventional demagnification projection exposure apparatus cannot cope with the patterns of the semiconductor devices which are becoming finer as the integration density is improved.

In order to eliminate the above described problem, the so-called phase shift method has been proposed. According to the phase shift method, the phase of the light transmitted through the reticle is shifted by a phase shift layer, so as to improve the resolution and contrast of the exposed image on the resist.

FIG. 3 shows the imaging optical system of the demagnification projection exposure apparatus and the reticle used when carrying out the phase shift method. In FIG. 3, those parts which are the same as those corresponding parts in FIG. 1 are designated by the same reference numerals, and a description thereof will be omitted.

In FIG. 3, a phase shift reticle 6 is used in place of the reticle 1 shown in FIG. 1. The phase shift reticle 6 is made up of the glass substrate 2 and a phase shift layer 7 which is formed on the glass substrate 2.

FIG. 4 is a diagram for explaining the light intensity of the exposure light on the positive resist when the phase shift reticle 6 is used. FIG. 4(a) shows a partial cross section of the phase shift reticle 6. The pattern which is to be exposed is formed by an edge part of the phase shift layer 7 which is formed on the glass substrate 2 of the phase shift reticle 6. A transmitted light 8' which has passed through the glass substrate 2 and the phase shift layer 7 has a phase which is shifted by 180° (π) with respect to a transmitted light 8 which has passed through only the glass substrate 2.

FIG. 4(b) shows the light amplitude distribution on the resist of the wafer 5 when the exposure is made using the phase shift reticle 6. As shown, the light amplitude becomes zero at a position of the resist corresponding to the edge part of the phase shift layer 7, and the light amplitude sharply reverses on both sides of the edge part.

FIG. 4(c) shows the light intensity distribution on the resist of the wafer 5 when the exposure is made using the phase shift reticle 6. Because the light intensity is proportional to the square of the light amplitude, the light intensity sharply becomes zero at a position of the resist corresponding to the edge part of the phase shift layer 7. Accordingly, it is possible to form on the resist a fine line-and-space pattern which has satisfactory resolution and contrast.

An example of a fine pattern formed by the phase shift method will be described with reference to FIG. 5. FIG. 5(a) shows a plan view of the phase shift reticle 6 which has a square phase shift layer 7. FIG. 5(b) shows a fine resist pattern 10 which is formed by the edge part of the phase shift layer 7 of the phase shift reticle 6 shown in FIG. 5(a). As shown in FIG. 5(b), the fine resist pattern 10 is formed at the side part of the square, that is, along a part on the resist corresponding to the edge part of the phase shift layer 7.

On the other hand, the phase shift layer 7 may be arranged in a checker board pattern in the plan view as shown in FIG. 6(a). When the phase shift reticle 6 having the phase shift layer 7 shown in FIG. 6(a) is used for the exposure, it is possible to form a resist pattern 10 which has edges with a fine contrast over a relatively large area as shown in FIG. 6(b).

However, when the phase shift reticle 6 described above is used for the exposure, it is impossible to pattern a cut part indicated by a dotted line in FIG. 5(b). In other words, the edge part of the phase shift layer 7 inevitably takes a closed contour (or loop), and there is a problem in that the actual patterns of integrated circuits (ICs) cannot be formed using the phase shift reticle 6.

Accordingly, in order to overcome this problem of the phase shift method, a modified method has been previously proposed to form the resist pattern using a phase shift reticle which has two kinds of phase shift layers as shown in FIG. 7. FIG. 7(a) shows a plan view of the resist pattern which is to be formed.

FIG. 7(b) shows a plan view of the previously proposed phase shift reticle 6. This phase shift reticle 6 has the phase shift layer 7 for shifting the phase of the exposure light by 180° ($\pi$) at the edge part which is used for the pattern forming, and a phase shift layer 12 for shifting the phase of the exposure light by 90° ($\pi/2$). This phase shift layer 12 is provided adjacent to the phase shift layer 7 at a part where no pattern forming is made, that is, at a part where the pattern is to be cut. A region indicated by hatchings in FIG. 7(b) is the region of the phase shift layer 7 which shifts the phase of the exposure light by 180°. On the other hand, a region indicated by dots in FIG. 7(b) is the region of the phase shift layer 12 which shifts the phase of the exposure light by 90°. Unmarked regions other than the hatched and dotted regions are the regions of the glass substrate 2.

By appropriately setting the exposure condition or the developing condition of the resist, only the edge part formed by the phase shift layer 7 and the glass substrate 2 as shown in FIG. 7(c). Other parts, that is, the edge part formed by the phase shift layers 7 and 12 and the edge part formed by the phase shift layer 12 and the glass substrate 2, are not patterned. The edge part formed by the phase shift layer 12 and the glass substrate 2 is indicated by a dotted line in FIG. 7(c).

However, this previously proposed modified phase shift method has a problem in that it is extremely difficult in actual practice to realize the phase shift reticle 6 having the phase shift layers 7 and 12 which are finely shaped as described. Accordingly, there are demands to realize a more feasible phase shift method which can form fine resist patterns and to realize a mask suitable for carrying out such a phase shift method.

SUMMARY OF THE INVENTION

Accordingly, it is a general object of the present invention to provide a novel and useful pattern exposing method and a mask used therefor, in which the problems described above are eliminated and the above described demand is satisfied.

Another and more specific object of the present invention is to provide a pattern exposing method for forming a predetermined resist pattern on a substrate, comprising the steps of (a) exposing a resist layer which is formed on the substrate using a first reticle which includes a first pattern for exposing a first corresponding pattern on the resist layer by use of a phase shift of light transmitted through the first reticle, (b) exposing the resist layer using a second reticle which has a second pattern for exposing a second corresponding pattern on the resist layer by use of light transmitted through the second reticle, where the second corresponding pattern overlaps at least a part of the first corresponding pattern, and (c) developing the resist layer so that a part of the first corresponding pattern is removed by the second corresponding pattern and the predetermined resist pattern is formed. According to the pattern exposing method of the present invention, it is possible to form extremely fine patterns and holes which exceed the resolution limit of the imaging optical system and could not be formed by the conventional techniques.

Still another object of the present invention is to provide a pattern exposing method for forming a predetermined resist pattern on a substrate, comprising the steps of (a) exposing a first resist layer which is formed on the substrate using a first reticle which includes a first pattern for exposing a first corresponding pattern on the first resist layer by use of a phase shift of light transmitted through the first reticle, (b) developing the exposed first resist layer, (c) forming a second resist layer on the entire surface of the substrate including a top of the first resist layer, (d) exposing the second resist layer using a second reticle which has a second pattern for exposing a second corresponding pattern on the second resist layer by use of light transmitted through the second reticle, where the second corresponding pattern overlaps at least a part of the first corresponding pattern, and (e) developing the second resist layer so that a part of the first corresponding pattern is removed by the second corresponding pattern and the predetermined resist pattern is formed. According to the pattern exposing method of the present invention, it is possible to form extremely fine patterns and holes which exceed the resolution limit of the imaging optical system and could not be formed by the conventional techniques.

A further object of the present invention is to provide a pattern exposing method for forming a predetermined resist pattern on a substrate, comprising the steps of (a) exposing a resist layer which is formed on the substrate using a reticle which includes a pattern for exposing a corresponding pattern on the resist layer by use of a phase shift of light transmitted through the reticle, where the pattern of the reticle is defined by a phase shift layer formed on a transparent reticle substrate and having first and second phase shift parts, and (b) developing the resist layer so that the predetermined resist pattern is formed on the substrate, where the step (a) exposes the corresponding pattern on the resist layer using edge parts of the first and second phase shift parts, the first phase shift part has a width such that a closed ring pattern is exposed by the edge parts thereof, and the second phase shift part has a width narrower than that of the first phase shift part so that patterns exposed by the edge parts thereof overlap in the form of a single line pattern. According to the pattern exposing method of the present invention, it is possible to form extremely fine resist patterns having various shapes.

Another object of the present invention is to provide a mask for use in exposing a predetermined pattern on a resist layer which is formed on a substrate using a shift in phase of light transmitted through the mask, comprising a transparent reticle substrate, and a phase shift layer formed on the transparent reticle substrate and having first and second phase shift parts, where the first and second phase shift parts have edge parts defining the predetermined pattern which is exposed on the resist layer, the first phase shift part has a width such that a closed ring pattern is exposed by the edge parts thereof, and the second phase shift part has a width narrower than that of the first phase shift part so that patterns exposed by the edge parts thereof overlap in the form of a single line pattern. According to the mask of the present invention, it is possible to expose extremely fine resist patterns having various shapes.

Other objects and further features of the present invention will be apparent from the following detailed description when read in conjunction with the accompanying drawings.

BRIEF DESCRIPTION OF THE DRAWINGS

FIGS. 9(a)–9(c) are diagrams for explaining the first embodiment when cutting a pattern;

DESCRIPTION OF THE PREFERRED EMBODIMENTS

A description will be given of a first embodiment of a pattern exposing method according to the present invention, by referring to FIG. 8.

Figure 3:
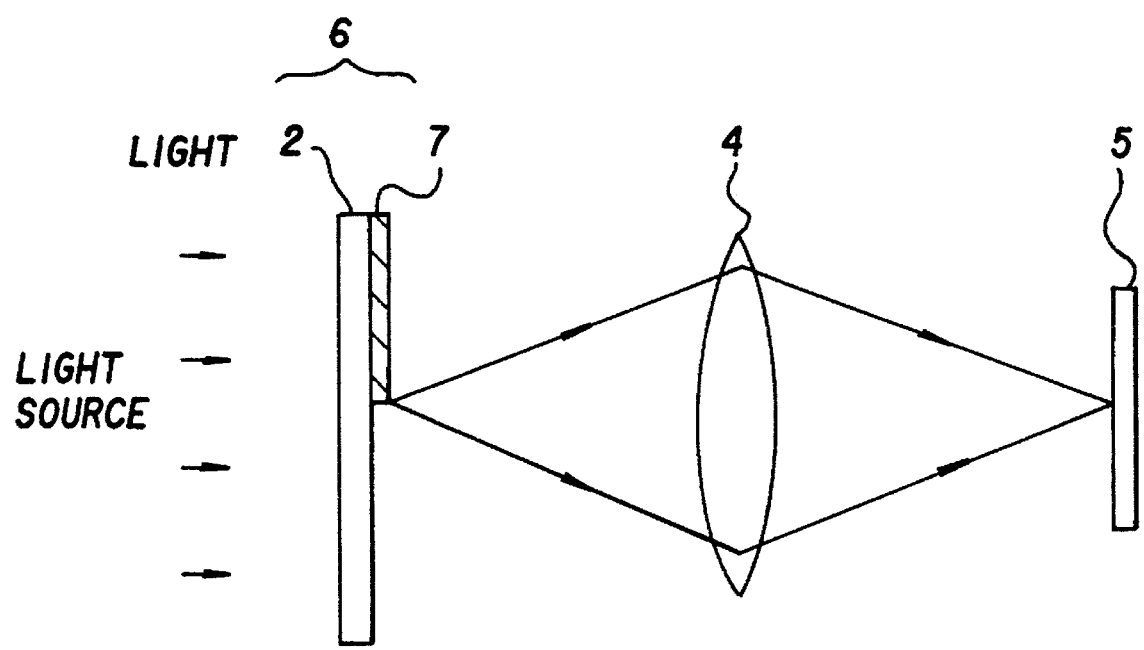
FIG. 3 generally shows an imaging optical system of a conventional demagnification projection exposure apparatus using a phase shift method and a conventional phase shift reticle.
Figure 7A:
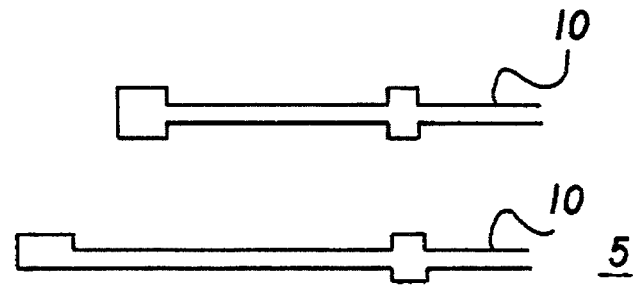
FIGS. 7(a)–7(c) are diagrams for explaining a previously proposed modified phase shift method using a phase shift reticle having two kinds of phase shift layers.
Figure 8A:
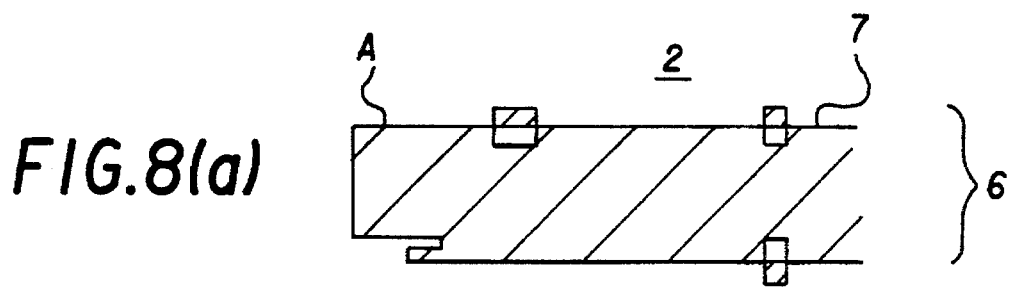
FIGS. 8(a)–8(c) are diagrams for explaining a first embodiment of a pattern exposing method according to the present invention.

FIG. 8(a) shows a plan view of a phase shift reticle 6 which is used in this embodiment. A phase shift layer 7 is formed on a glass substrate 2, similarly as in the conventional case where the resist pattern shown in FIG. 7(a) is to be formed. The optical system shown in FIG. 3 is used to make a first demagnification projection exposure on a positive resist which is formed on a wafer 5 (not shown in FIG. 8) using the phase shift reticle 6. During this first exposure, an edge part A which is indicated by a bold line in FIG. 8(a) is also exposed although this edge part A should not be exposed.

Figure 8B:
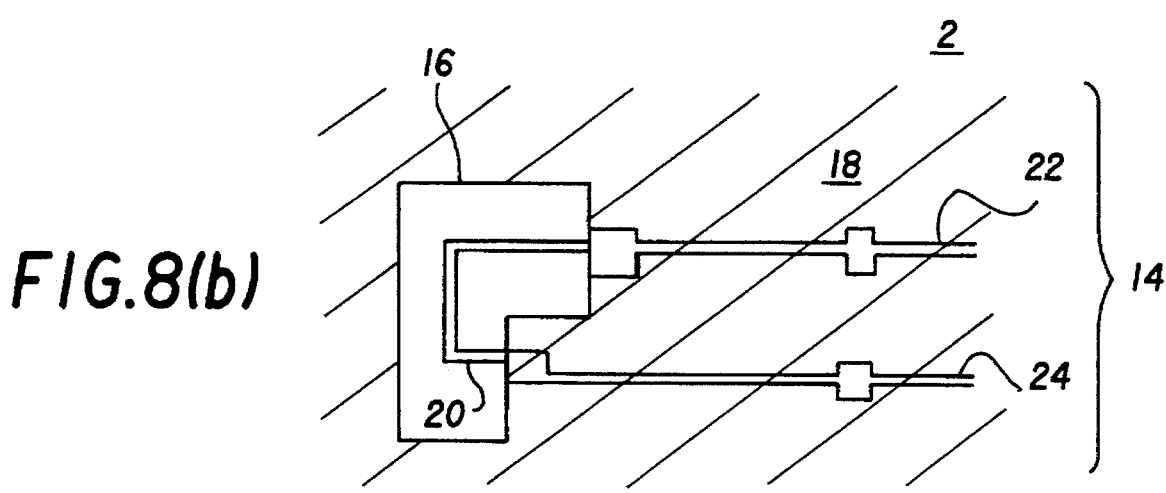

Next, a second demagnification projection exposure is made using a reticle 14 which has an opening 16 formed in a Cr light blocking layer 18 on a glass substrate 2, as shown in FIG. 8(b). Non-exposed parts 20, 22 and 24 which are not exposed during the first exposure exist on the resist at parts corresponding to the edge part of the phase shift layer 7. Out of these non-exposed parts 20, 22 and 24, the non-exposed part 20 is exposed during the second exposure. The opening 16 is provided in the reticle 14 in order to expose this non-exposed part 20.

Figure 1:
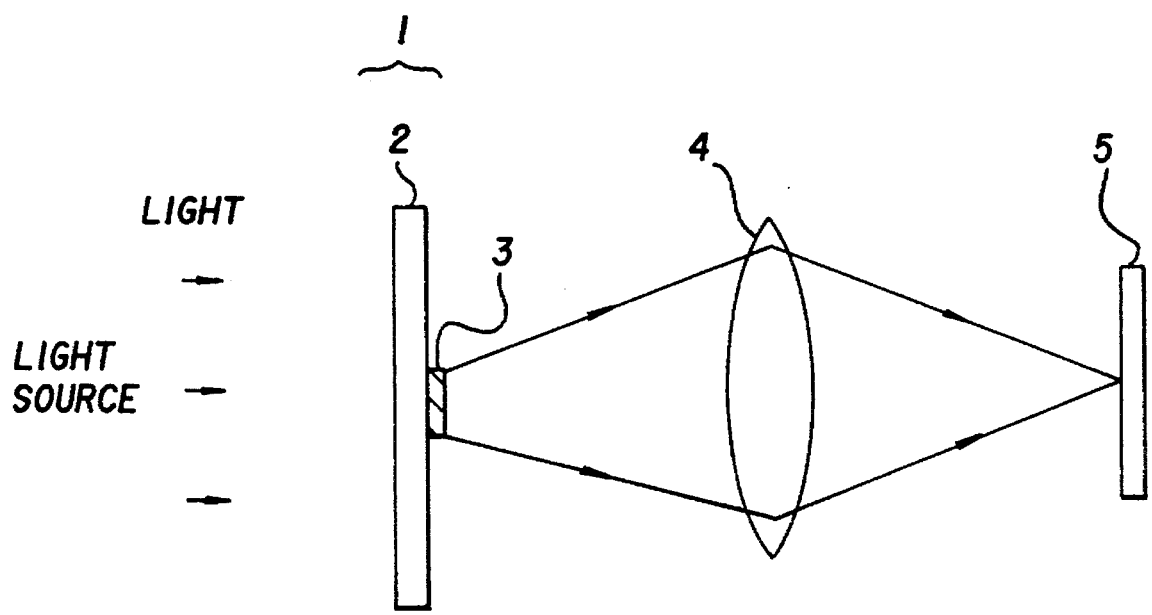
FIG. 1 generally shows an imaging optical system of a conventional demagnification projection exposure apparatus and a conventional reticle.
Figure 8C:
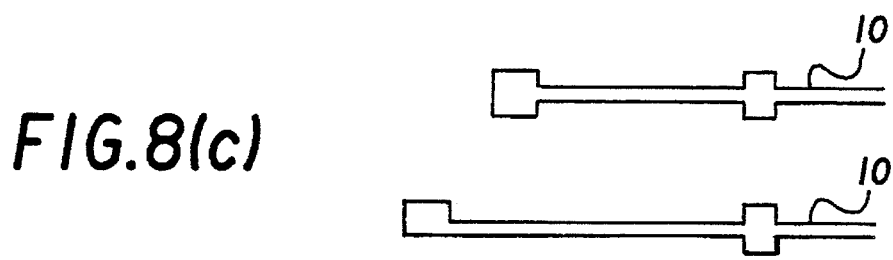

The second exposure is made similarly to the demagnification projection exposure described above with reference to FIG. 1, after aligning the reticle 14 to the resist pattern which is formed by the first exposure. When the second exposure is made, the positive resist on the wafer 5 at a part corresponding to an area within the opening 16 of the reticle 14 is exposed twice and is thus removed by a developing process which is carried out thereafter. As a result, a resist pattern corresponding to the edge part A which is indicated by the bold line in FIG. 8(a) is not formed, and the resist pattern is cut at a predetermined position as indicated in FIG. 8(c).

Next, a description will be given of the matters to be considered in this embodiment, such as the alignments of the phase shift reticle 6 used during the first exposure and the reticle 14 used during the second exposure, by referring to FIG. 9.

FIG. 9(a) is a diagram for explaining a minimum width to be cut and the like to be considered when cutting the resist pattern in this embodiment. When cutting in two exposures a pattern 30 and a pattern 32 which are non-exposed parts before the resist is developed, a minimum width B to be cut must be made larger than the resolution which is determined by the normal reticle 14 which uses an opening in the light blocking layer for the exposure and the conventional imaging optical system shown in FIG. 1. In addition, a distance C from an edge of the pattern 32 to a contact hole forming part 36, for example, must be determined by taking into account not only the above resolution but also an alignment error of the reticle 14. A distance from an edge of the pattern 30 to a contact hole forming part 34 must be determined similarly. Furthermore, a pattern width of the fine pattern which is actually formed spreads by approximately 0.1 μm from the edge of the phase shift layer 7, and this spread is approximately proportional to a value $\lambda/NA$ of the optical system, where $\lambda$ denotes the wavelength of the exposure light and NA denotes the numerical aperture of the optical system.

In other words, a width G of a contact part of the pattern 32 which is exposed on the resist as shown in FIG. 9(c) is greater than a width F of an edge part forming the contact part as shown in FIG. 9(b). In addition, an alignment error of the two reticles 6 and 14 is approximately 0.15 μm. This alignment error depends on the accuracy of the mask and the accuracy of the alignment mechanism. Accordingly, when aligning the phase shift reticle 6 and the reticle 14, it is necessary to set a distance D between an edge of the contact part forming part of the phase shift layer 7 of the phase shift reticle 6 and a corresponding edge of the opening 16 of the reticle 14 to approximately 0.1 to 0.25 μm, so that the edge part of the contact part of the pattern 32 on the resist will not be removed by the second exposure which uses the reticle 14.

By making the first and second exposures using the two kinds of reticles, namely, the phase shift reticle 6 and the reticle 14, it becomes possible to easily form an extremely fine resist pattern shown in the plan view of FIG. 9(a).

Next, a description will be given of a second embodiment of the pattern exposing method according to the present invention, by referring to FIG. 10. In FIG. 10, those parts which are the same as those corresponding parts in FIG. 8 are designated by the same reference numerals, and a description thereof will be omitted.

In this embodiment, the resist pattern is basically formed similarly to the first embodiment. The difference between the first and second embodiments is that, the resist pattern formed by the second embodiment has a plurality of cuts, as in the case of the actual patterns used in the semiconductor device.

Figure 10A:
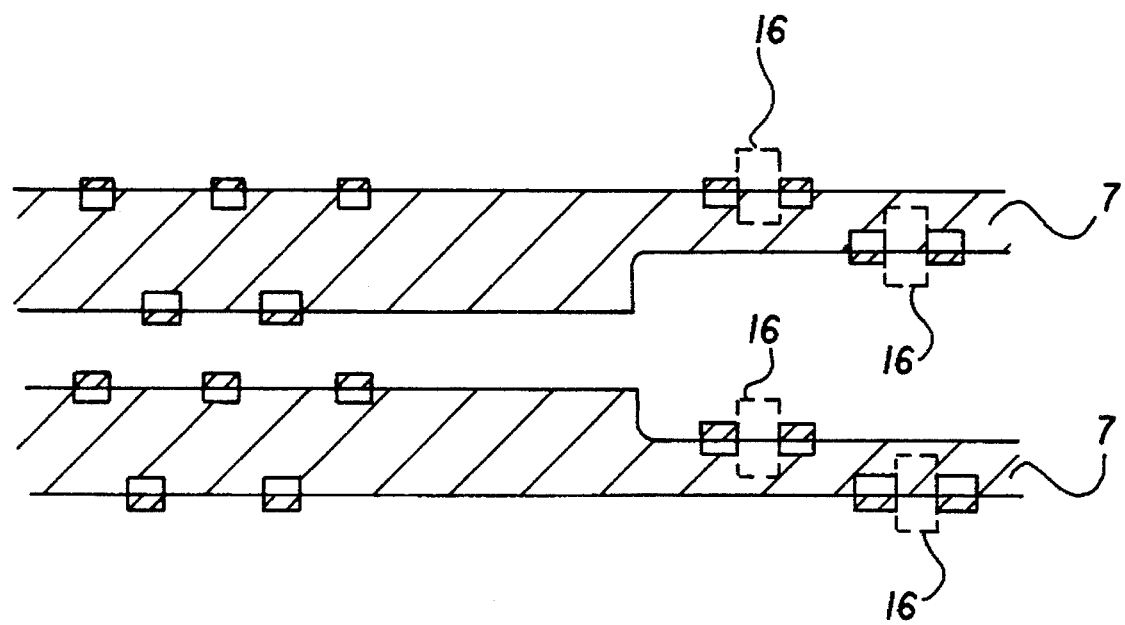
FIGS. 10(a)–10(b) are diagrams for explaining a second embodiment of the pattern exposing method according to the present invention.

FIG. 10(a) shows a plan view of the phase shift reticle 6 which is used for the first exposure and the reticle 14 which is used for the second exposure in an overlapped state. In FIG. 10(a), a part surrounded by a dotted line corresponds to an area which is exposed by the second exposure using the opening 16.

Figure 10B:
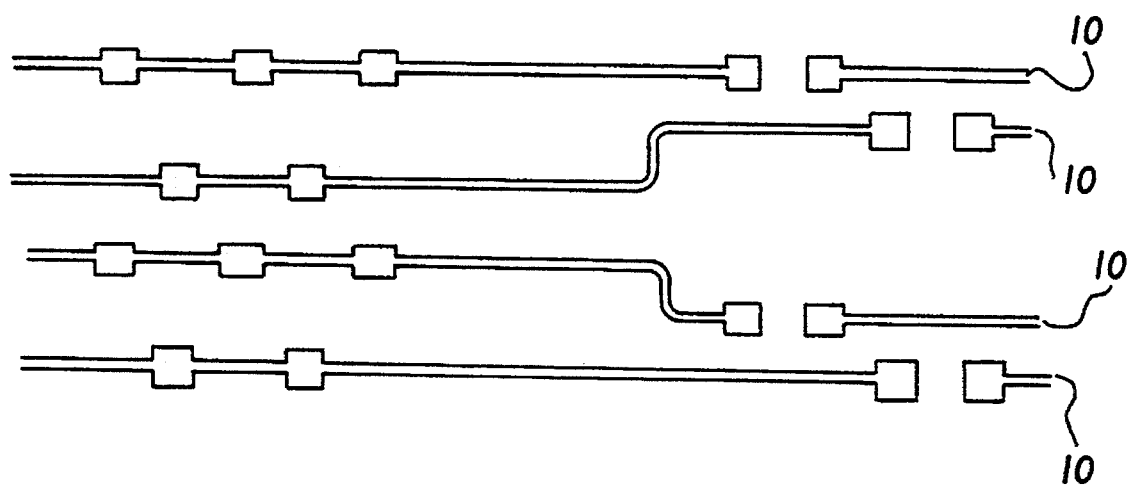

FIG. 10(b) shows a completed pattern 10 which is completed by cutting appropriate parts of the pattern which is formed by the edge part of the phase shift layer 7 of the phase shift reticle 6 shown in FIG. 10(a) during the first exposure by the making the second exposure using the opening 16 of the reticle 14. As may be readily understood from the description above, it is possible to form an extremely fine resist pattern having a plurality of cuts using the double exposure.

Next, a description will be given of a third embodiment of the pattern exposing method according to the present invention, by referring to FIG. 11. In FIG. 11, those parts which are the same as those corresponding parts in FIG. 10 are designated by the same reference numerals, and a description thereof will be omitted.

In this embodiment, the resist pattern is basically formed similarly to the second embodiment. In other words, the resist pattern formed by the third embodiment has a plurality of cuts, as in the case of the actual patterns used in the semiconductor device.

Figure 11A:
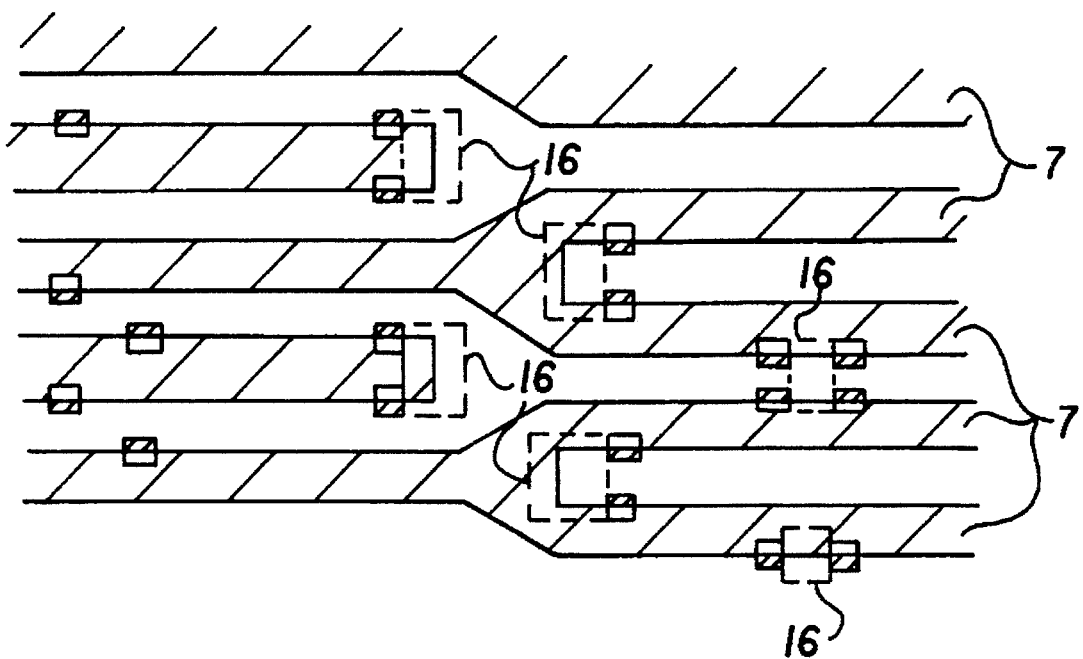
FIGS. 11(a)–11(b) are diagrams for explaining a third embodiment of the pattern exposing method according to the present invention.

FIG. 11(a) shows a plan view of the phase shift reticle 6 which is used for the first exposure and the reticle 14 which is used for the second exposure in an overlapped state. In FIG. 11(a), a part surrounded by a dotted line corresponds to an area which is exposed by the second exposure using the opening 16.

Figure 11B:
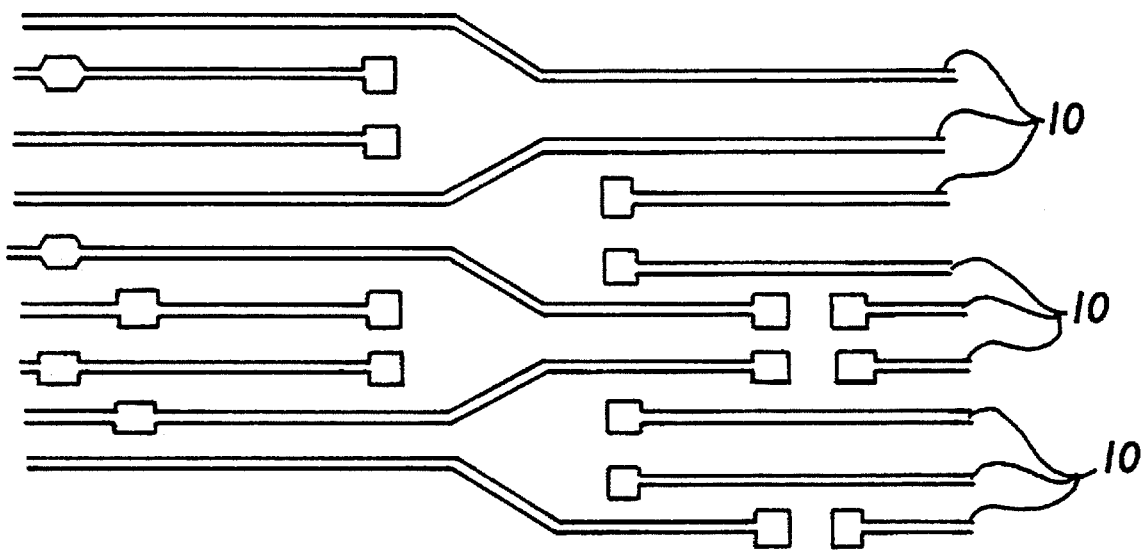

FIG. 11(b) shows a completed pattern 10 which is completed by cutting appropriate parts of the pattern which is formed by the edge part of the phase shift layer 7 of the phase shift reticle 6 shown in FIG. 11(a) during the first exposure by the making the second exposure using the opening 16 of the reticle 14. As may be readily understood from the description above, it is possible to form an extremely fine resist pattern having a plurality of cuts using the double exposure.

When forming a circuit pattern having a large integration density, the resist pattern becomes complex as shown in FIG. 11(b). Hence, the edges of the phase shift layer 7 of the phase shift reticle 6 which is used during the first exposure become very close to each other. In addition, the number of parts where the resist pattern must be cut is large. However, as long as the phase shift reticle 6 used for the first exposure and the reticle 14 used for the second exposure are aligned correctly, it is possible to easily cut the resist pattern at the large number of parts using the double exposure because the opening 16 in the light blocking layer 18 of the reticle 14 can be formed without difficulties using the existing technique.

Figure 7B:
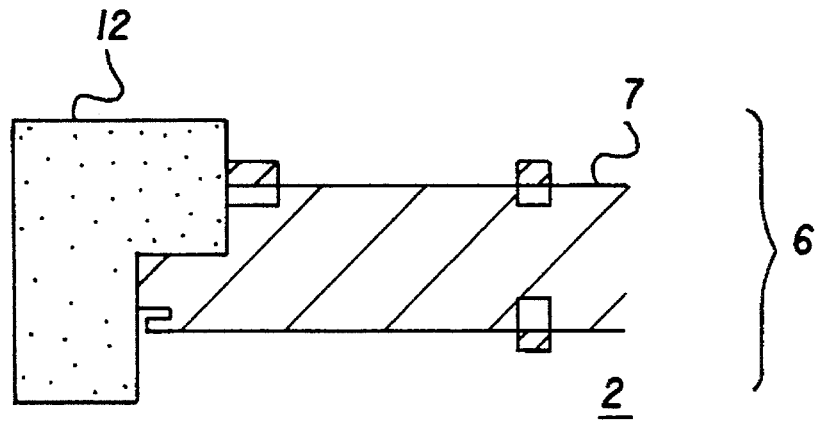
Figure 7C:
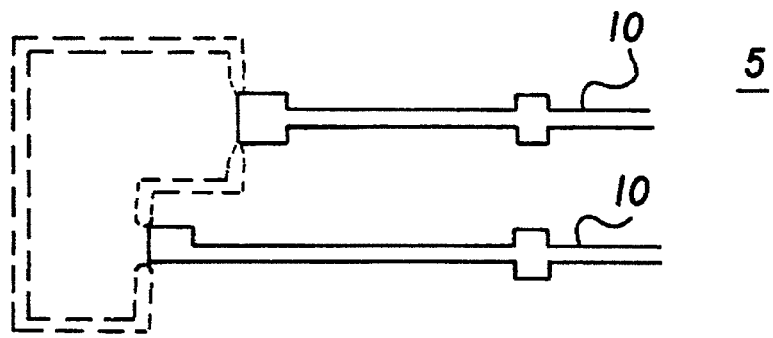

As the line width of the pattern becomes finer, the pitch of the circuit patterns becomes narrower. However, it is possible to easily cope with this situation by the reticle 14 which is used for the second exposure and has the opening 16 formed in the light blocking layer 18 thereof. In the previously proposed modified phase shift method described above with reference to FIG. 7 which requires two kinds of phase shift layers to be formed on the single substrate, it is extremely difficult technically to make a phase shift reticle on which a plurality of phase shift layers 7 and 12 coexist, thereby making this method unsuited for practical use. But according to this embodiment, both the phase shift reticle 6 and the reticle 14 can be made with a sufficiently high accuracy using the existing techniques.

In the embodiments described above, the phase shift layer is formed on the glass substrate in a closed region which is surrounded by the edge part of the phase shift layer. However, this arrangement may be reversed so that the glass substrate forms the closed region and the phase shift layer is formed in a region other than the closed region of the glass substrate.

In addition, the phase shift reticle used for the first exposure is not limited to that used in the first through third embodiments. Although the embodiments use the phase shift reticle which has the phase shift layer and no light blocking layer to make the phase shift, it is possible to use other types of phase shift reticles such as a phase shift reticle employing the so-called Levenson type phase shift.

Therefore, according to the first through third embodiments, it is possible to form an extremely fine pattern which exceeds the resolution limit of the imaging optical system and could not be formed by the conventional techniques.

Next, a description will be given of a fourth embodiment of the pattern exposing method according to the present invention, by referring to FIG. 12. In this embodiment, a resist pattern is formed for use in forming an extremely fine hole of the semiconductor device. More particularly, this embodiment uses the phase shift reticle 6 to form on a negative resist a resist pattern having a fine rectangular hole.

Figure 4A:
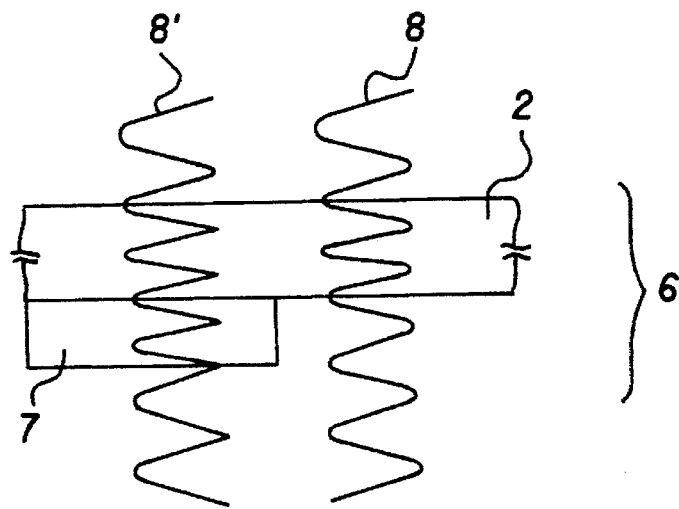
FIGS. 4(a)–4(c) are diagrams for explaining an exposure light intensity on a resist of the conventional phase shift reticle.
Figure 4B:
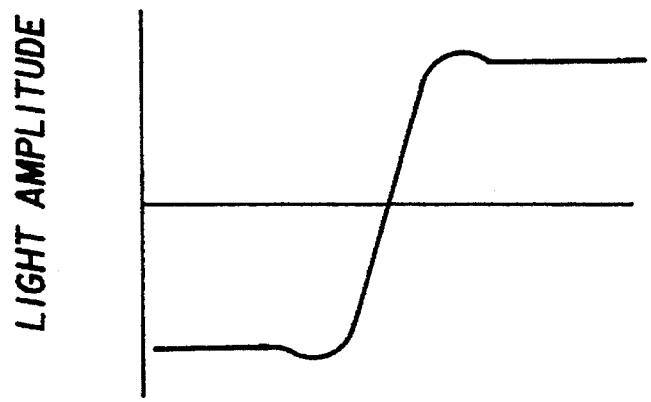
Figure 4C:
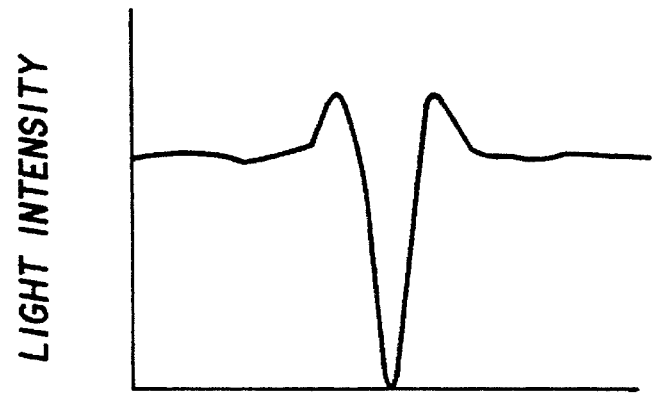
Figure 5A:
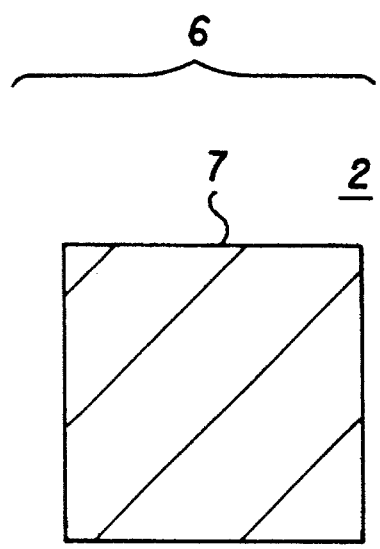
FIGS. 5(a)–5(b) are diagrams for explaining a resist pattern formed by the conventional phase shift reticle.
Figure 5B:
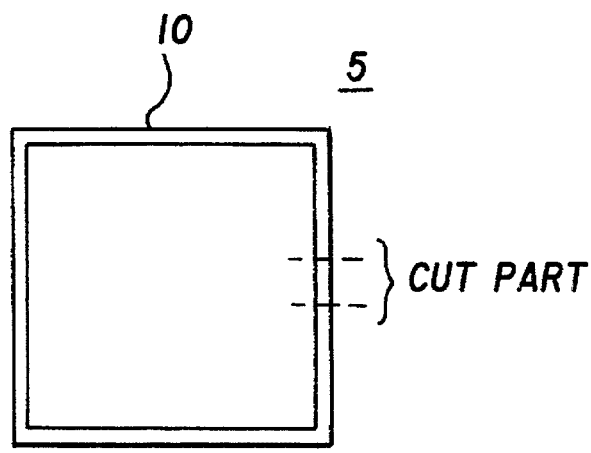
Figure 6A:
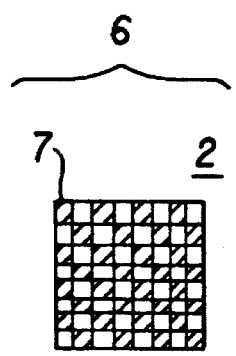
FIGS. 6(a)–6(b) are diagrams for explaining another resist pattern formed by the conventional phase shift reticle.
Figure 6B:
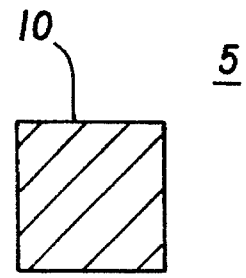
Figure 12A:
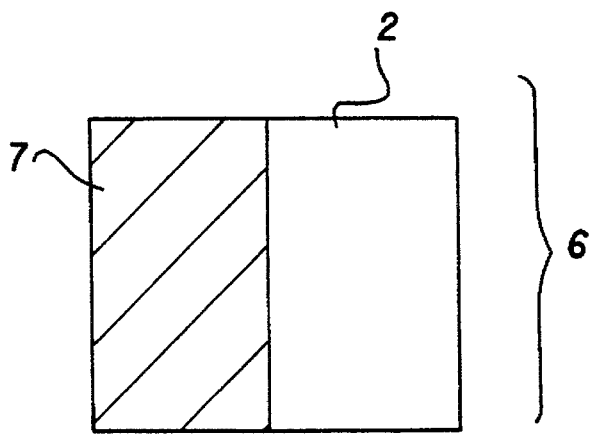
FIGS. 12(a)–12(e) are diagrams for explaining a fourth embodiment of the pattern exposing method according to the present invention.

FIG. 12(a) shows a plan view of the phase shift reticle 6 which has the phase shift layer 7 formed on the glass substrate 2. This phase shift reticle 6 may be the phase shift reticle 6 shown in FIG. 4, for example.

Figure 12B:
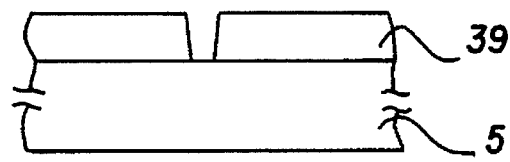

In FIG. 12(b) which shows a partial cross section of the wafer 5, a negative resist 39 is formed on the wafer 5 and a first demagnification projection exposure is made using the phase shift reticle 6 shown in FIG. 12(a). The negative resist 39 is developed after the first exposure, and a fine space pattern shown in FIG. 12(b) is formed in the negative resist 39 by the edge pattern of the phase shift layer 7 of the phase shift reticle 6 shown in FIG. 12(a).

Figure 12C:
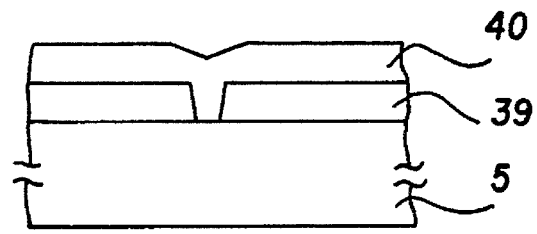

Then, a negative resist 40 is formed on the entire top surface of the wafer 5 as shown in FIG. 12(c).

Figure 12D:
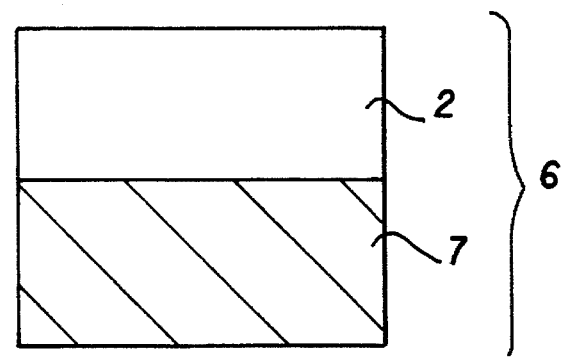

Next, a phase shift reticle 6 shown in FIG. 12(d) having a pattern which is rotated by 90° with respect to the phase shift reticle shown in FIG. 12(a) is used to make a second demagnification projection exposure. By developing the negative resist 40 after the second exposure, a fine space pattern is formed in the negative resist 40 by the edge pattern of the phase shift layer 7 of the phase shift reticle 6 shown in FIG. 12(d).

Figure 12E:
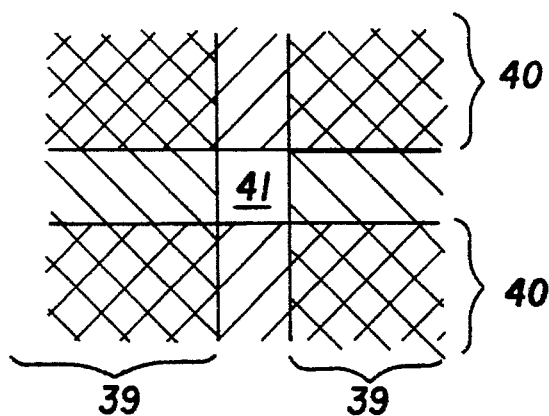

As a result, the fine space pattern formed in the negative resist 39 and the fine space pattern formed in the negative resist 40 intersect perpendicularly to each other, and a fine rectangular hole 41 shown in FIG. 12(e) is formed at the intersection.

For example, if the exposure light is the i-line and the numerical aperture of the optical system is 0.5, it is possible to make each side of the fine rectangular hole 41 approximately 0.2 μm. Therefore, by enabling the formation of such a fine hole, it becomes possible to further improve the integration density of semiconductor devices.

According to this embodiment, it is possible to sharpen the negative peak of the light intensity distribution on the resist by using the phase shift reticles 6 and making the first and second exposures. In other words, the line-and-space having a satisfactory resolution and contrast in the X direction and the line-and-space having a satisfactory resolution and contrast in the Y direction are formed by two independent exposures, and it is possible to form at the intersection of the two line-and-spaces a fine rectangular hole which cannot be formed by the existing technique using only one exposure. Therefore, the fine rectangular hole which is formed has sharp edges and the corners of the hole do not become rounded.

Next, a description will be given of a fifth embodiment of the pattern exposing method according to the present invention, by referring to FIGS. 13 and 14.

Figure 13A:
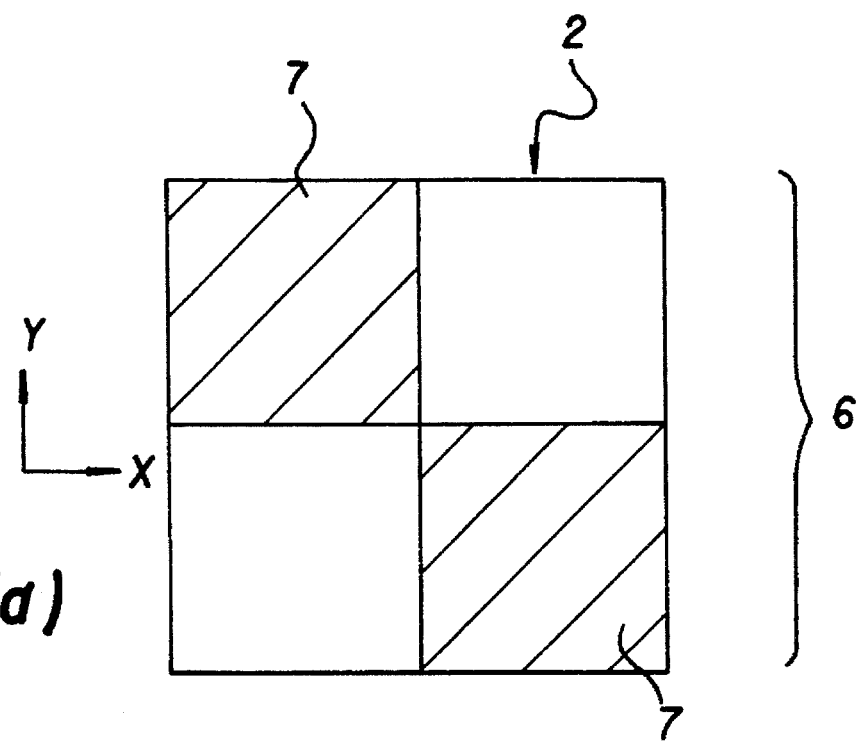
FIGS. 13(a)–13(b) and 14(a)–14(c) are diagrams for explaining a fifth embodiment of the pattern exposing method according to the present invention.
Figure 14A:
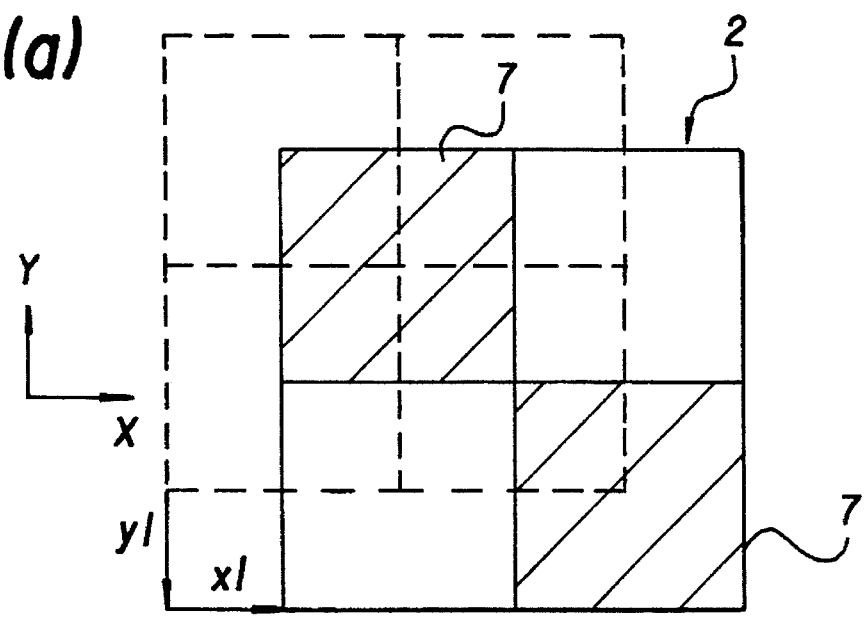

FIG. 13(a) shows a plan view of a phase shift reticle 6 which is used in this embodiment. As shown, this phase shift reticle 6 has the regions where only the glass substrate 2 exist and the regions where the phase shift layer 7 is formed, in an alternate manner along the X and Y directions.

Figure 13B:
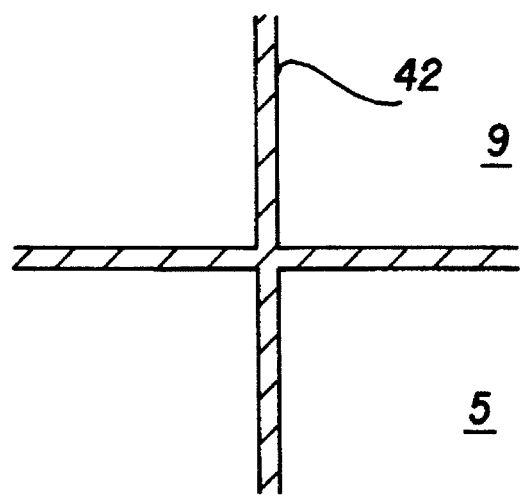

By forming the negative resist 39 on the wafer 5 and making a first demagnification projection exposure using the phase shift reticle 6 shown in FIG. 13(a) and developing the negative resist 39 after this first exposure, a fine space pattern 42 shown in FIG. 13(b) is formed by the edge pattern of the phase shift layer 7 of the phase shift reticle 6 shown in FIG. 13(a).

Next, the negative resist 40 is formed on the entire top surface of the wafer 5. Thereafter, the phase shift reticle 6 shown in FIG. 13(a) or the wafer 5 is moved as indicated by a dotted line in FIG. 14(a) so that the pattern of the phase shift reticle 6 shown in FIG. 13(a) is relatively shifted by x1 in the +X direction and by y1 in the −Y direction with respect to the wafer 5. From the point of view of improving the throughput of the lithography process, the above relative shift is desirably carried out by keeping the phase shift reticle 6 fixed and moving an X-Y stage which carries the wafer 5 and forms a part of the exposure apparatus.

Figure 14B:
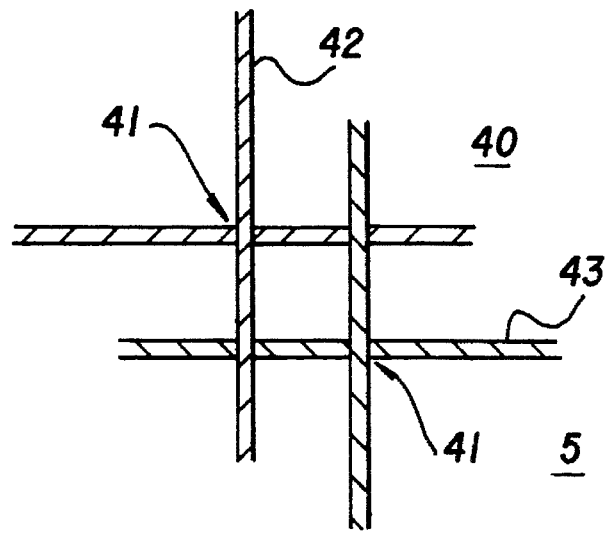
Figure 14C:
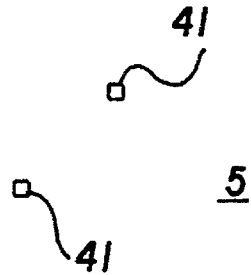

Then, a second demagnification projection exposure is made using the same phase shift reticle 6 shown in FIG. 13(a), and the negative resist 40 is developed thereafter to form a fine space pattern 43 shown in FIG. 14(b) which is formed by the edge pattern of the phase shift layer 7 of the phase shift reticle 6. The fine space pattern 42 which is formed in the negative resist 39 and the fine space pattern 43 which is formed in the negative resist 40 intersect perpendicularly, and thus, fine rectangular hole 41 are formed at the intersections as shown in FIG. 14(c).

According to this embodiment, the fine rectangular holes which are formed have sharp edges and the corners of the holes do not become rounded, similarly as in the case of the fourth embodiment.

Next, a description will be given of a sixth embodiment of the pattern exposing method according to the present invention, by referring to FIG. 15.

Figure 15A:
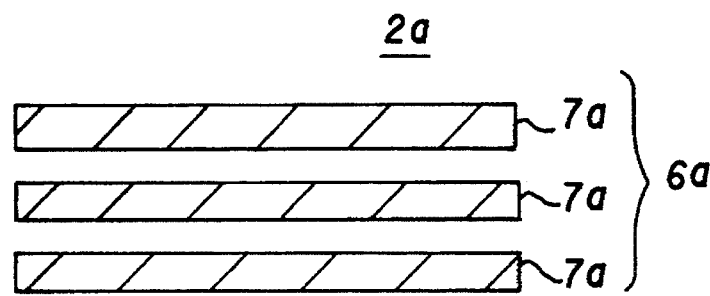
FIGS. 15(a)–15(d) are diagrams for explaining a sixth embodiment of the pattern exposing method according to the present invention.

In this embodiment, a phase shift reticle 6a which is shown in a plan view in FIG. 15(a) is used for the first exposure. This phase shift reticle 6a is made up of a glass substrate 2a, and a plurality of oblong phase shift layers 7a arranged in parallel on the glass substrate 2a.

Figure 15B:
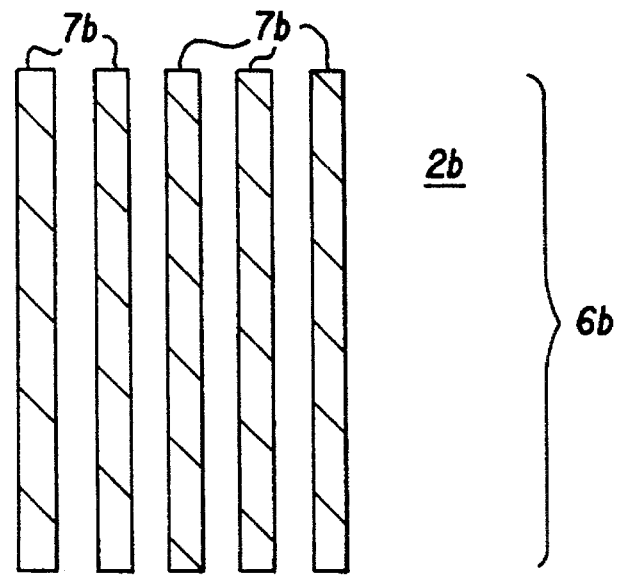

Then, a phase shift reticle 6b which is shown in a plan view in FIG. 15(b) is used for the second exposure. This phase shift reticle 6b is made up of a glass substrate 2b, and a plurality of oblong phase shift layers 7b arranged in parallel on the glass substrate 2b. The direction in which the oblong phase shift layers 7b extend is perpendicular to the direction in which the oblong phase shift layers 7a of the phase shift reticle 6a extend.

Figure 15C:
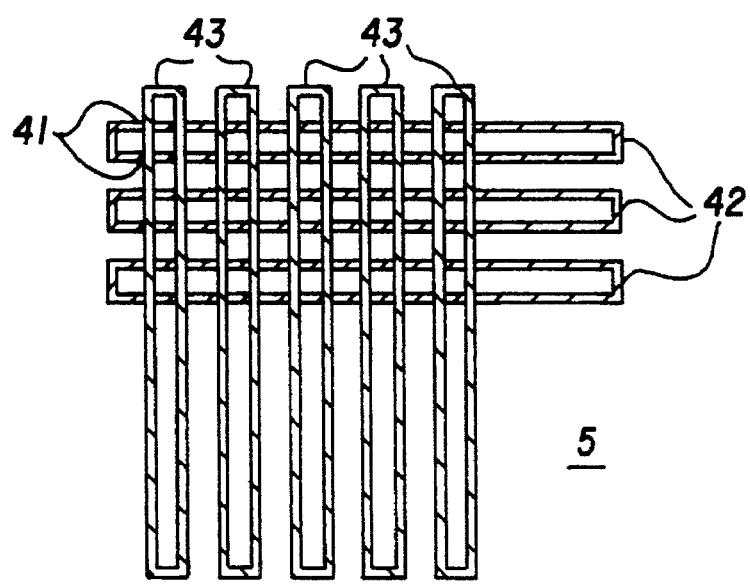
Figure 15D:
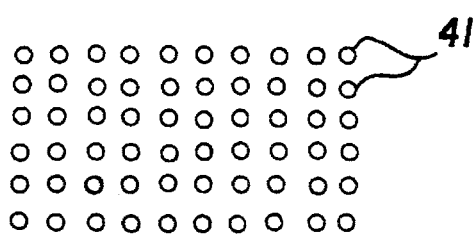

Prior to making the first exposure, a negative resist 39 is formed on the wafer 5, similarly as in the case shown in FIG. 12(b), and the negative resist 39 is patterned by the first exposure using the phase shift reticle 6a shown in FIG. 15(a). As a result, fine space patterns 42 shown in FIG. 15(c) are formed in the negative resist 39 by the edge parts of the phase shift layers 7a.

Next, prior to making the second exposure, a negative resist 40 is formed on the entire top surface of the wafer 5, similarly as in the case shown in FIG. 12(c), and the negative resist 40 is patterned by the second exposure using the phase shift reticle 6b shown in FIG. 15(b). As a result, fine space patterns 43 shown in FIG. 15(c) are formed in the negative resist 40 by the edge parts of the phase shift layers 7b.

The fine space patterns 42 and the fine space patterns 43 intersect perpendicularly to each other. Thus, a fine rectangular hole 41 is formed at each intersection of the fine space patterns 42 and 43. In this embodiment, the fine rectangular holes 41 are simultaneously formed with the arrangement shown in FIG. 15(d).

Next, a description will be given of a seventh embodiment of the pattern exposing method according to the present invention, by referring to FIG. 16.

Figure 16A:
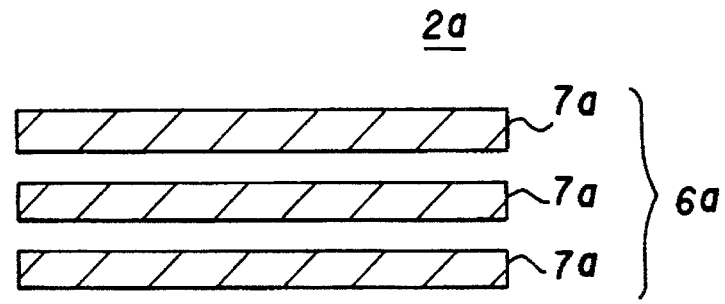
FIGS. 16(a)–16(d) are diagrams for explaining a seventh embodiment of the pattern exposing method according to the present invention.

In this embodiment, a phase shift reticle 6a which is shown in a plan view in FIG. 16(a) is used for the first exposure. This phase shift reticle 6a is identical to that used in the sixth embodiment.

Figure 16B:
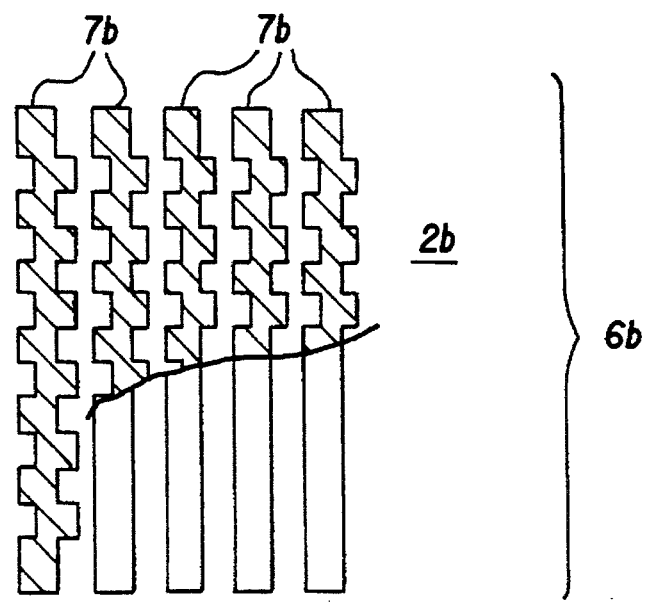

Then, a phase shift reticle 6b which is shown in a plan view in FIG. 16(b) is used for the second exposure. This phase shift reticle 6b is made up of a glass substrate 2b, and a plurality of zigzag phase shift layers 7b arranged in parallel on the glass substrate 2b. The direction in which the zigzag phase shift layers 7b extend is perpendicular to the direction in which the oblong phase shift layers 7a of the phase shift reticle 6a extend.

Figure 17A:
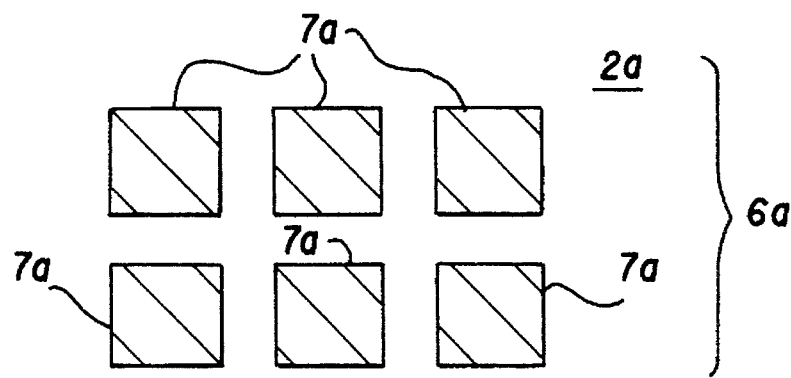
FIGS. 17(a)–17(d) are diagrams for explaining an eighth embodiment of the pattern exposing method according to the present invention.

Prior to making the first exposure, a negative resist 39 is formed on the wafer 5, similarly as in the case shown in FIG. 12(b), and the negative resist 39 is patterned by the first exposure using the phase shift reticle 6a shown in FIG. 17(a). As a result, fine space patterns 42 shown in FIG. 17(c) are formed in the negative resist 39 by the edge parts of the phase shift layers 7a.

Figure 16C:
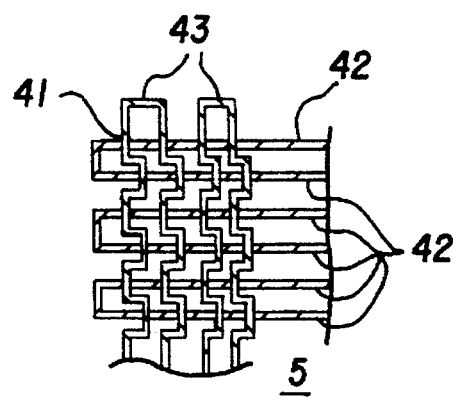
Figure 16D:
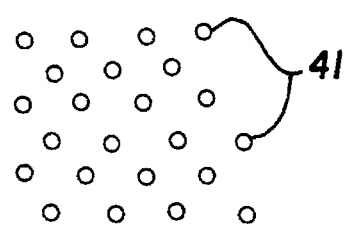

Next, prior to making the second exposure, a negative resist 40 is formed on the entire top surface of the wafer 5, similarly as in the case shown in FIG. 12(c), and the negative resist 40 is patterned by the second exposure using the phase shift reticle 6b shown in FIG. 16(b). As a result, fine space patterns 43 shown in FIG. 16(c) are formed in the negative resist 40 by the edge parts of the phase shift layers 7b.

The fine space patterns 42 and the fine space patterns 43 intersect, and thus, a fine rectangular hole 41 is formed at each intersection of the fine space patterns 42 and 43. In this embodiment, the fine rectangular holes 41 are simultaneously formed with the arrangement shown in FIG. 16(d). In other words, by forming the zigzag along the edge part of the phase shift layer 7b, it becomes possible to arbitrarily set the positional relationships of the fine rectangular holes 41, and various positional relationships other than that shown in FIG. 15(d) becomes possible.

Next, a description will be given of an eighth embodiment of the pattern exposing method according to the present invention, by referring to FIG. 17.

In this embodiment, a phase shift reticle 6a which is shown in a plan view in FIG. 17(a) is used for the first exposure. This phase shift reticle 6a is made up of a glass substrate 2a, and a plurality of square phase shift layers 7a arranged at predetermined intervals on the glass substrate 2a.

Figure 17B:
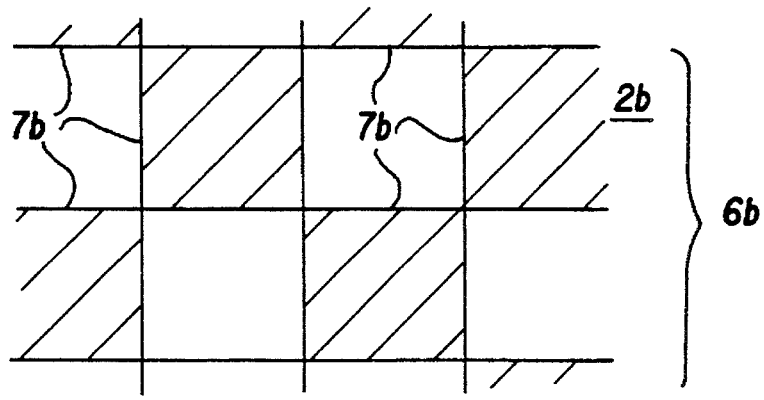
Figure 17C:
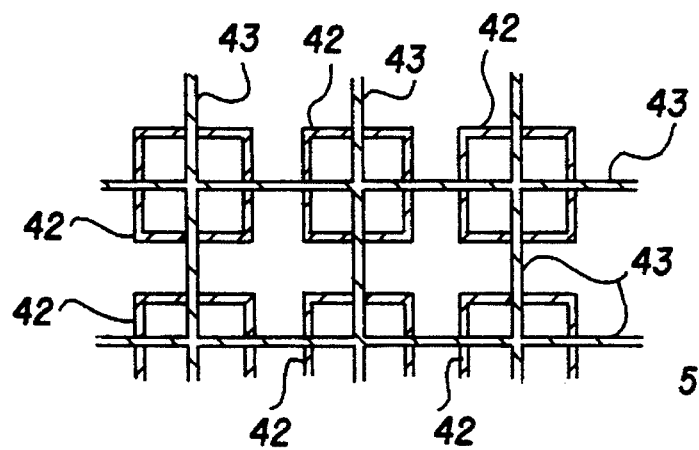
Figure 17D:
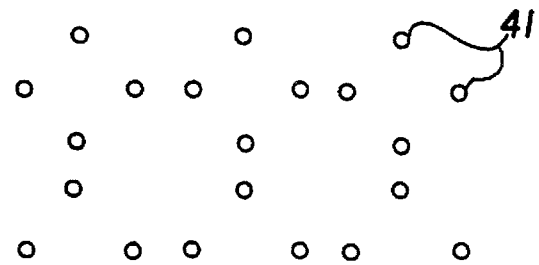

Then, a phase shift reticle 6b which is shown in a plan view in FIG. 17(b) is used for the second exposure. This phase shift reticle 6b is made up of a glass substrate 2b, and a plurality of square phase shift layers 7b arranged in a checker board pattern on the glass substrate 2b. The square phase shift layers 7b are arranged so that edge parts of the square phase shift layers 7b are perpendicular to edge parts of the square phase shift layers 7a of the phase shift reticle 6a.

Prior to making the first exposure, a negative resist 39 is formed on the wafer 5, similarly as in the case shown in FIG. 12(b), and the negative resist 39 is patterned by the first exposure using the phase shift reticle 6a shown in FIG. 17(a). As a result, fine space patterns 42 shown in FIG. 17(c) are formed in the negative resist 39 by the edge parts of the phase shift layers 7a.

Next, prior to making the second exposure, a negative resist 40 is formed on the entire top surface of the wafer 5, similarly as in the case shown in FIG. 12(c), and the negative resist 40 is patterned by the second exposure using the phase shift reticle 6b shown in FIG. 17(b). As a result, fine space patterns 43 shown in FIG. 17(c) are formed in the negative resist 40 by the edge parts of the phase shift layers 7b.

The fine space patterns 42 and the fine space patterns 43 intersect, and thus, a fine rectangular hole 41 is formed at each intersection of the fine space patterns 42 and 43. In this embodiment, the fine rectangular holes 41 are simultaneously formed with the arrangement shown in FIG. 17(d). In other words, by appropriately selecting the shape of the edge part of the phase shift layers 7a and 7b, it becomes possible to arbitrarily set the positional relationships of the fine rectangular holes 41, and various positional relationships other than that shown in FIG. 15(d) becomes possible.

Next, a description will be given of a ninth embodiment of the pattern exposing method according to the present invention, by referring to FIGS. 18 and 19.

Figure 18A:
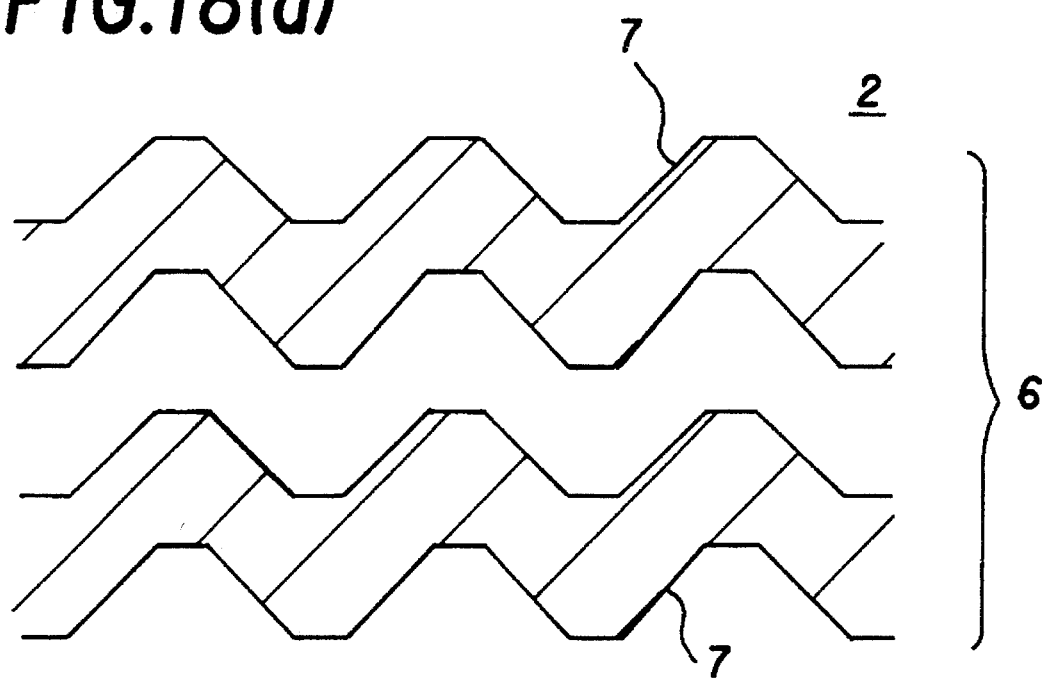
FIGS. 18(a–18(b) and 19(a)–19(b) are diagrams for explaining a ninth embodiment of the pattern exposing method according to the present invention.

In this embodiment, a phase shift reticle 6 which is shown in a plan view in FIG. 18(a) is used for the first exposure. This phase shift reticle 6 is made up of a glass substrate 2, and a plurality of zigzag (or sawtooth shaped) phase shift layers 7 extending parallel to each other on the glass substrate 2.

Figure 18B:
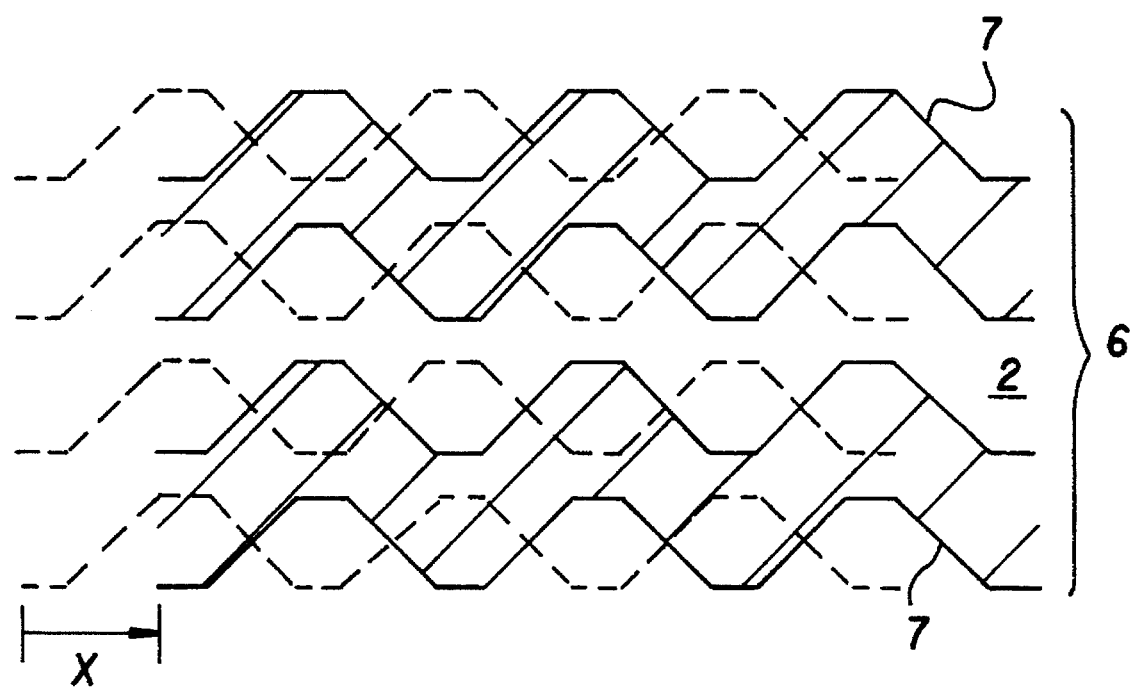

Then, the same phase shift reticle 6 shown in FIG. 18(a) is used for the second exposure by shifting the position of the phase shift reticle 6 in the X direction from the position of the phase shift reticle 6 at the time of the first exposure, as shown in FIG. 18(b). When the phase shift reticle 6 is shifted in this manner, the edge parts of the phase shift layers 7 during the first exposure intersect perpendicularly to the edge parts of the phase shift layers 7 during the second exposure.

Figure 19A:
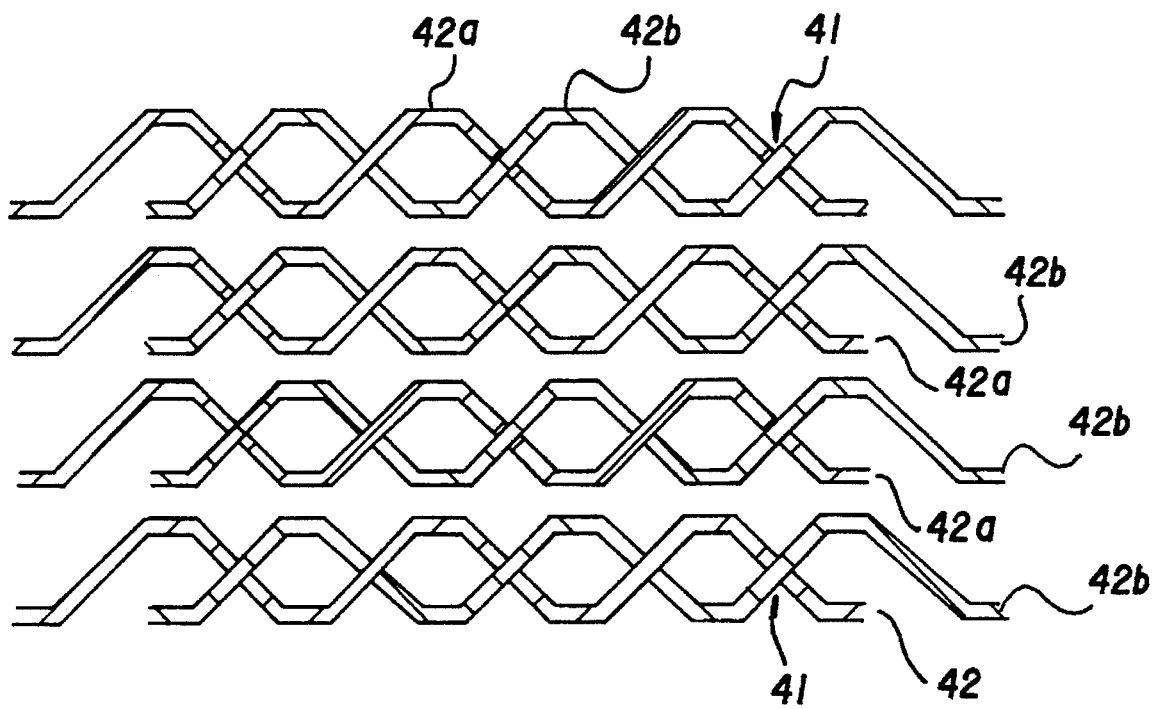
Figure 19B:
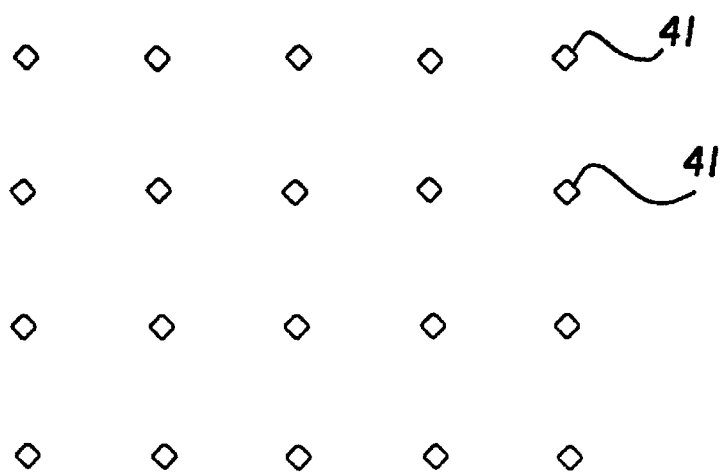

Prior to making the first exposure, a negative resist 39 is formed on the wafer 5, similarly as in the case shown in FIG. 12(b), and the negative resist 39 is patterned by the first exposure using the phase shift reticle 6 shown in FIG. 18(a). As a result, fine space patterns 42a shown in FIG. 19(a) are formed in the negative resist 39 by the edge parts of the phase shift layers 7.

Next, prior to making the second exposure, a negative resist 40 is formed on the entire top surface of the wafer 5, similarly as in the case shown in FIG. 12(c). In addition, the same phase shift reticle 6 shown in FIG. 18(a) is shifted in the X direction by a predetermined distance by moving the X-Y stage which carries the wafer 5 and forms a part of the exposure apparatus, for example. As a result, the position of the phase shift reticle 6 which is used for the second exposure is relatively shifted with respect to the position of the phase shift reticle 6 which is used for the first exposure, as shown in FIG. 18(b). In FIG. 18(b), the position of the phase shift reticle 6 used during the first exposure is indicated by a dotted line. Therefore, when the negative resist 40 is patterned by the second exposure using the phase shift reticle 6 shown in FIG. 18(a) which is shifted in position relative to the phase shift reticle 6 used during the first exposure, fine space patterns 42b shown in FIG. 19(a) are formed in the negative resist 40 by the edge parts of the phase shift layers 7.

The fine space patterns 42a and the fine space patterns 42b intersect, and thus, a fine rectangular hole 41 is formed at each intersection of the fine space patterns 42a and 42b. In this embodiment, the fine rectangular holes 41 are simultaneously formed with the arrangement shown in FIG. 19(b). In other words, by appropriately selecting the shape of the edge part of the phase shift layers 7 and appropriately shifting the position of the phase shift reticle 6 between the first and second exposures, it becomes possible to arbitrarily set the positional relationships of the fine rectangular holes 41, and various positional relationships other than that shown in FIG. 15(d) becomes possible.

According to this embodiment, there is an additional advantage in that the plurality of fine rectangular holes 41 can be formed simultaneously using only one kind of phase shift reticle 6. As a result, there is no need to change the phase shift reticle 6 between the first and second exposures, and the throughput of the lithography process is improved compared to the other embodiments.

In the fourth through ninth embodiments, it is of course not essential for the edge part of the phase shift layer of the phase shift reticle which is used during the first exposure to intersect perpendicularly to the edge part of the phase shift layer of the phase shift reticle which is used during the second exposure. As long as the edge parts intersect, it is possible to form a fine hole. In other words, it is possible to form fine holes having an arbitrary shape other than the rectangular shape.

Therefore, according to the fourth through ninth embodiments, it is possible to form an extremely fine hole which exceeds the resolution limit of the imaging optical system and could not be formed by the conventional techniques.

The contrast is particularly good according to these embodiments, because one resist layer is formed exclusively for each exposure. In other words, if a single resist layer were subjected to both the first and second exposures, the contrast of the hole which is formed would deteriorate by approximately 50%, and the edges of the formed hole would become rounded. However, such a contrast deterioration will not occur according to these embodiments, and it is possible to form a fine hole having the designed shape with a high accuracy.

Next, a description will be given of a tenth embodiment of the pattern exposing method according to the present invention, by referring to FIG. 20. In this embodiment and the embodiments described hereafter, elements such as the wafer are not shown, but the same reference numerals will be used as in the previously described embodiments.

Figure 20A:
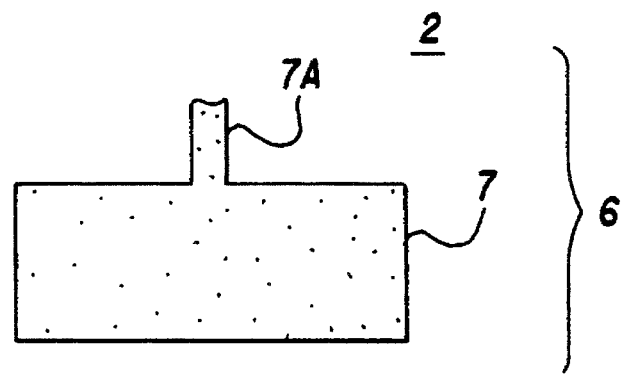
FIGS. 20(A)–20(D) are diagrams for explaining a tenth embodiment of the pattern exposing method according to the present invention.

This embodiment forms a T-shaped pattern on the wafer 5. First, a positive resist 39 is formed on the wafer 5, and a phase shift reticle 6 having a phase shift layer (phase shift pattern) 7 as shown in a plan view of FIG. 20(A) is used for the first exposure. The phase shift layer 7 of the phase shift reticle 6 includes a narrow part 7A. This narrow part 7A has a width such that the patterns generated by the edge part of the narrow part 7A overlap and form a single line pattern.

Figure 20B:
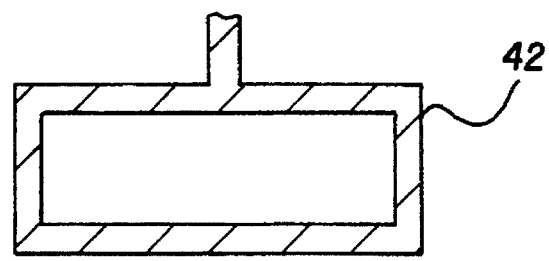

The positive resist 39 at parts other than the periphery of the phase shift layer 7 is exposed by the first exposure, and a resist pattern 42 shown in FIG. 20(B) is formed on the wafer 5.

Figure 20C:
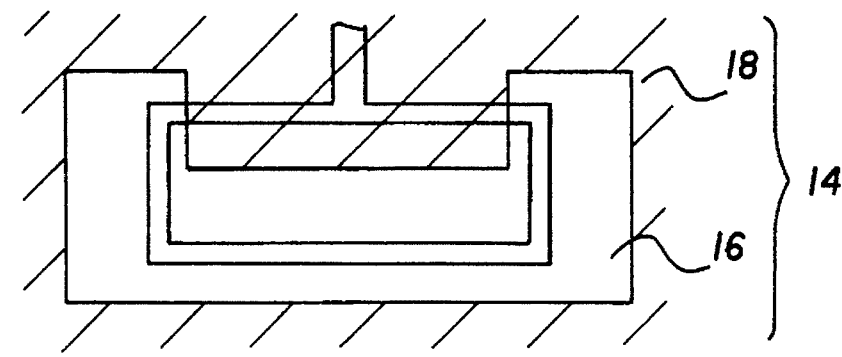

Then, a reticle 14 having an opening 16 in a light blocking layer 18 thereof as shown in FIG. 20(C) is used for the second exposure.

Figure 20D:
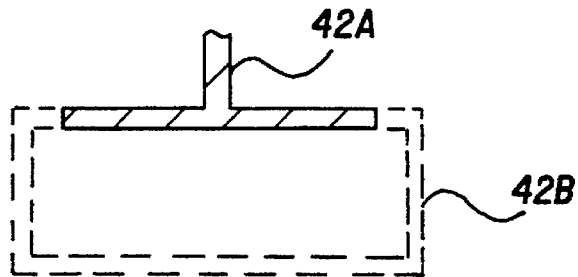

After the second exposure, the positive resist 39 is developed, thereby forming a T-shaped resist pattern 42A on the wafer 5 as shown in FIG. 20(D). A resist pattern 42B which is indicated by a dotted line in FIG. 20(D) and is exposed during the first exposure is completely removed after the second exposure and the developing process.

Figure 2A:
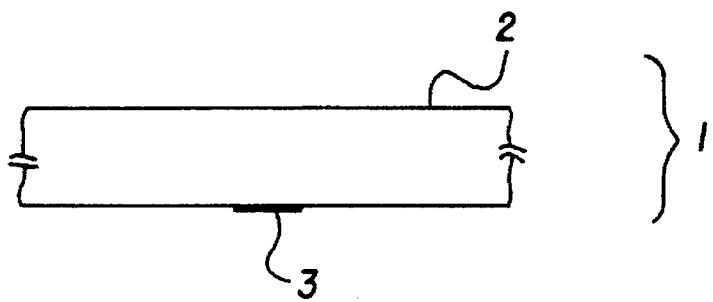
FIGS. 2(a)–2(c) are diagrams for explaining an exposure light intensity on a resist using the conventional reticle.
Figure 2B:
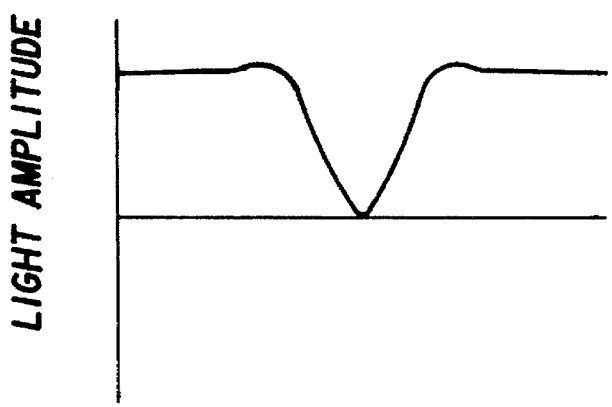
Figure 2C:
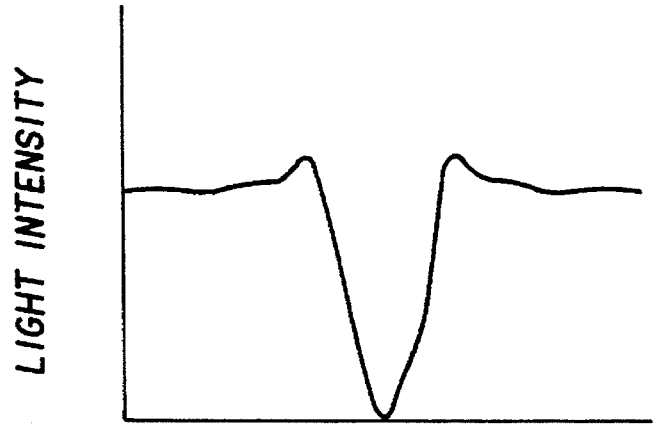

The reticle 6 used in this embodiment forms an embodiment of a mask according to the present invention. This reticle 6 includes the phase shift pattern 7 which is used to form a narrow line pattern by the edge part thereof, and the narrow part 7A which is used to form a line pattern which is wider than that of the line pattern formed by the phase shift pattern 7. In other words, the phase shift pattern which uses the concept described above with reference to FIG. 2 and the phase shift pattern which uses the concept described above with reference to FIG. 4 coexist on the reticle 6.

If the line width of the phase shift pattern 7 which has a relatively large area in FIG. 20(A) were made narrow as in the case of the narrow part 7A, it would become unnecessary to form by the T-shaped resist pattern by two independent exposures. However, the resolution of the pattern which is formed by the edge part of the phase shift pattern does not improve if the width of the phase shift pattern is narrow. This is the reason why the first and second exposures are made in this embodiment. For example, if the i-line is used as the exposure light and the numerical aperture NA of the optical system is 0.5, for example, the resolution of the pattern formed by the edge part of the phase shift pattern is 0.2 μm. However, the resolution of the phase shift pattern which is only 0.15 μm and narrow, for example, is only 0.35 μm. Even if the width of the phase shift pattern is further reduced, the contrast would only deteriorate and the pattern which should be black would become gray. Therefore, the use of this embodiment of the mask, that is, the reticle 6 shown in FIG. 20(A), is extremely useful in forming fine resist patterns.

Next, a description will be given of an eleventh embodiment of the pattern exposing method according to the present invention, by referring to FIG. 21.

Figure 21A:
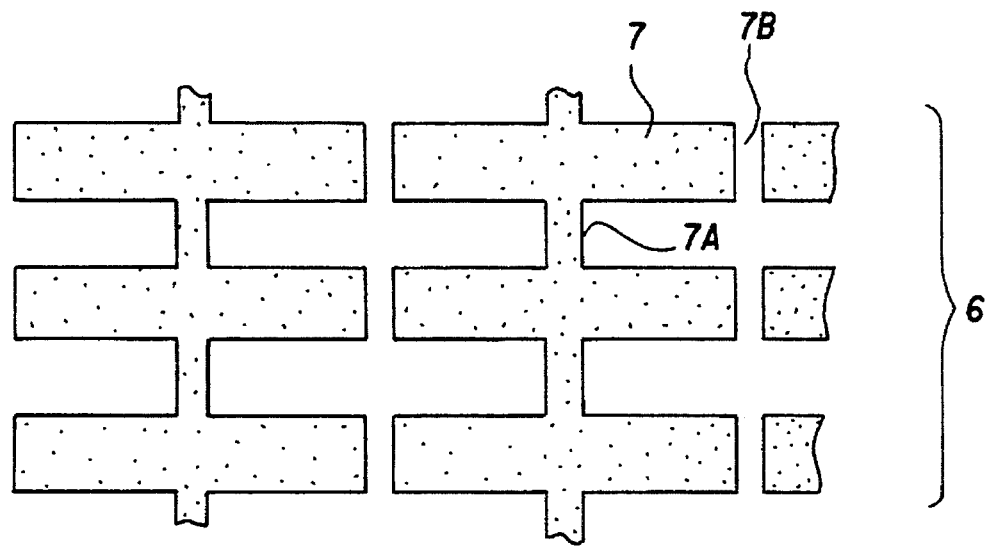
FIGS. 21(A)–21(B) are diagrams for explaining an eleventh embodiment of the pattern exposing method according to the present invention.

This embodiment forms a piled brick pattern on the wafer 5. First, a negative resist 39 is formed on the wafer 5, and a phase shift reticle 6 having phase shift layers (phase shift patterns) 7 as shown in a plan view of FIG. 21(A) is used for the exposure. The phase shift layer 7 of the phase shift reticle 6 includes a narrow part 7A. This narrow part 7A has a width such that the patterns generated by the edge part of the narrow part 7A overlap and form a single line pattern. In addition, an interval 7B is provided between adjacent phase shift patterns 7 so that the patterns generated by the edge parts of the adjacent phase shift patterns 7 overlap and form a single line pattern.

Figure 21B:
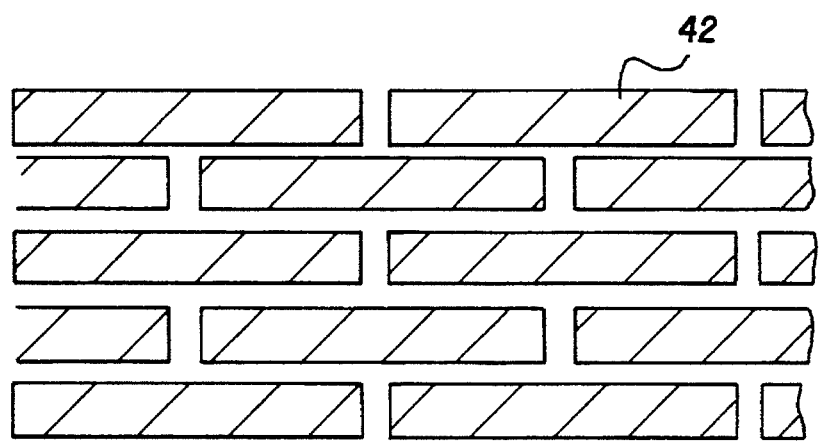

The resist 39 at parts other than the periphery of the phase shift layers 7 is exposed by the exposure, and a resist pattern 42 shown in FIG. 21(B) is formed on the wafer 5 after a developing process is carried out because the negative resist 9 is used in this embodiment.

The reticle 6 used in this embodiment also includes the phase shift pattern 7 which is used to form a narrow line pattern by the edge part thereof, and the narrow part 7A which is used to form a line pattern which is wider than that of the line pattern formed by the phase shift pattern 7. In other words, the phase shift pattern which uses the concept described above with reference to FIG. 2 and the phase shift pattern which uses the concept described above with reference to FIG. 4 coexist on the reticle 6.

Next, a description will be given of a twelfth embodiment of the pattern exposing method according to the present invention, by referring to FIG. 22.

Figure 22A:
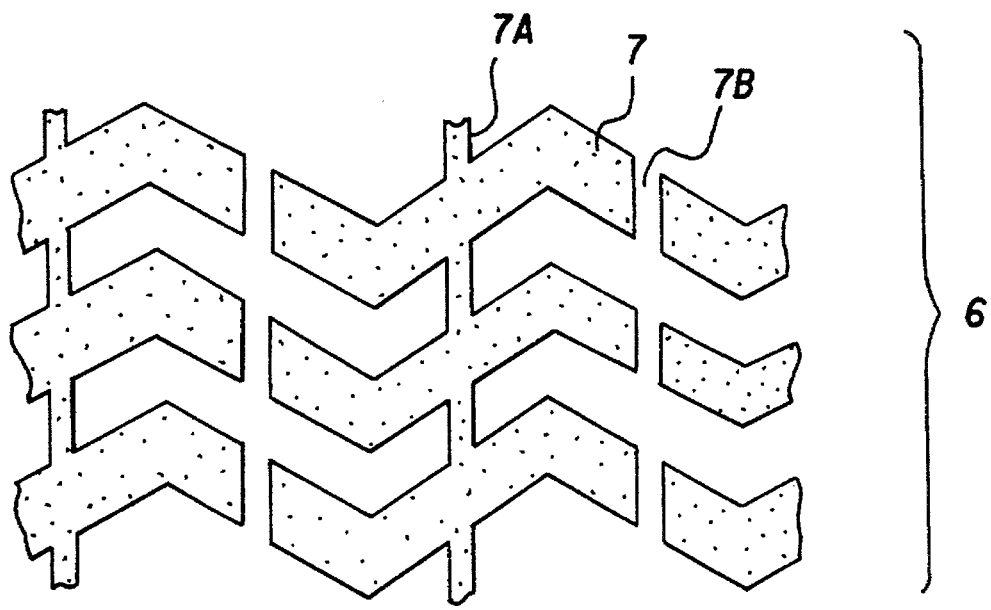
FIGS. 22(A)–22(B) are diagrams for explaining a twelfth embodiment of the pattern exposing method according to the present invention.

This embodiment forms a curved piled brick pattern on the wafer 5. First, a negative resist 39 is formed on the wafer 5, and a phase shift reticle 6 having phase shift layers (phase shift patterns) 7 as shown in a plan view of FIG. 22(A) is used for the exposure. The phase shift layer 7 of the phase shift reticle 6 includes a narrow part 7A. This narrow part 7A has a width such that the patterns generated by the edge part of the narrow part 7A overlap and form a single line pattern. In addition, an interval 7B is provided between adjacent phase shift patterns 7 so that the patterns generated by the edge parts of the adjacent phase shift patterns 7 overlap and form a single line pattern.

Figure 22B:
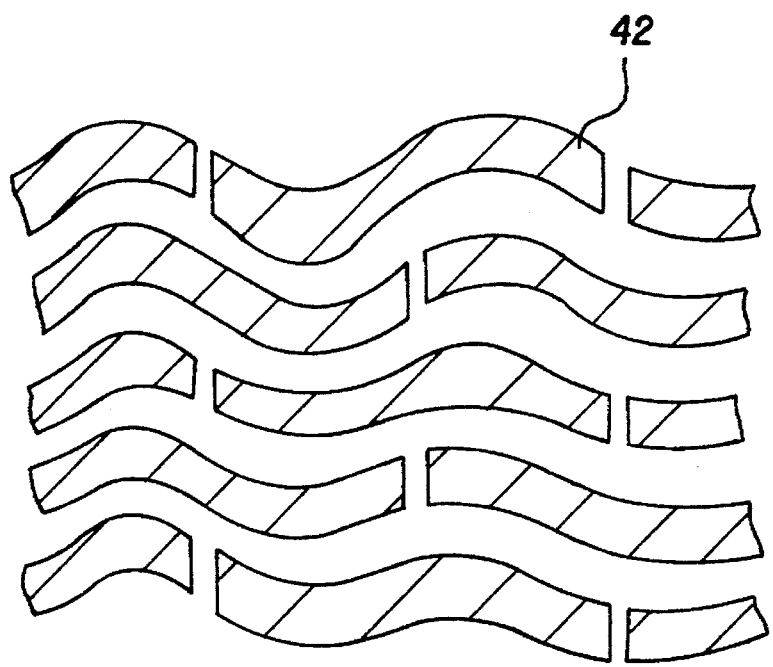

The resist 39 at parts other than the periphery of the phase shift layers 7 is exposed by the exposure, and a resist pattern 42 shown in FIG. 22(B) is formed on the wafer 5 after a developing process is carried out because the negative resist 39 is used in this embodiment.

The reticle 6 used in this embodiment also includes the phase shift pattern 7 which is used to form a narrow line pattern by the edge part thereof, and the narrow part 7A which is used to form a line pattern which is wider than that of the line pattern formed by the phase shift pattern 7. In other words, the phase shift pattern which uses the concept described above with reference to FIG. 2 and the phase shift pattern which uses the concept described above with reference to FIG. 4 coexist on the reticle 6.

The resist patterns formed by the eleventh and twelfth embodiments are particularly suited for use during the production process of a dynamic random access memory (DRAM), because the DRAM has active regions having the patterns shown in FIG. 22(B), for example.

In the eleventh and twelfth embodiments, if the widths of the narrow part 7A and the interval 7B between the adjacent phase shift patterns 7 respectively are 0.15 μm, the i-line is used as the exposure light and the numerical aperture NA of the optical system is 0.5, the width of the resist pattern 42 becomes 0.35 μm. The upper limit of the widths of the narrow part 7A and the interval 7B in this case are 0.3 μm, and the width of the resist pattern 42 for this upper limit value is 0.5 μm. If the widths of the the narrow part 7A and the interval 7B are greater than 0.3 μm, two peaks would exist in the corresponding light intensity distribution and the intended pattern cannot be obtained by the phase shift.

According to the tenth through twelfth embodiments of the pattern exposing method the present invention and the embodiment of the mask according to the present invention, it is possible to form resist patterns having various kinds of shapes by use of the reticle 6 on which the phase shift pattern which uses the concept described above with reference to FIG. 2 and the phase shift pattern which uses the concept described above with reference to FIG. 4 coexist.

Of course, in each of the embodiments described above, it is possible to selectively use positive and negative resists depending on the desired resist pattern which is to be formed on the wafer. In addition, the first and second exposures may use opposite types of resists depending on the resist pattern which is to be formed.

Further, the present invention is not limited to these embodiments, but various variations and modifications may be made without departing from the scope of the present invention.

What is claimed is:

1. A pattern exposing method for forming a predetermined resist pattern on a substrate, said pattern exposing method comprising the steps of:

(a) exposing a resist layer which is formed on the substrate using a reticle which includes a pattern for exposing a corresponding pattern on the resist layer by use of a phase shift of light transmitted through the reticle, said pattern of the reticle being defined by a phase shift layer formed on a transparent reticle substrate and having first and second phase shift parts; and (b) developing the resist layer so that the predetermined resist pattern is formed on the substrate, said step (a) exposing the corresponding pattern on the resist layer using edge parts of the first and second phase shift parts, said first phase shift part having a width such that a closed ring pattern is exposed by the edge parts thereof, said second phase shift part having a width narrower than that of the first phase shift part so that patterns exposed by the edge parts thereof overlap in the form of a single line pattern.

2. The pattern exposing method as claimed in claim 1, wherein said step (a) uses a negative resist as the resist layer.

3. A mask for use in exposing a predetermined pattern on a resist layer which is formed on a substrate using a shift in phase of light transmitted through the mask, said mask comprising:

a transparent reticle substrate; and a phase shift layer formed on the transparent reticle substrate and having first and second phase shift parts, said first and second phase shift parts having edge parts defining the predetermined pattern which is exposed on the resist layer, said first phase shift part having a width such that a closed ring pattern is exposed by the edge parts thereof, said second phase shift part having a width narrower than that of the first phase shift part so that patterns exposed by the edge parts thereof overlap in the form of a single line pattern.

4. The mask as claimed in claim 3, wherein the width of said second phase shift part is 0.3 μm at the maximum when an exposure light is an i-line and a numerical aperture of an optical system used for the exposure is 0.5.

5. The mask as claimed in claim 3, wherein an interval of two mutually adjacent first phase shift parts is 0.3 μm at the maximum when an exposure light is an i-line and a numerical aperture of an optical system used for the exposure is 0.5.

* * * * *